US012666688B2

(12) United States Patent
Jezewski et al.

(10) Patent No.: US 12,666,688 B2
(45) Date of Patent: Jun. 23, 2026

(54) LOW RESISTANCE METAL TO SEMICONDUCTOR CONTACTS FOR INTEGRATED NMOS AND PMOS TRANSISTORS

(71) Applicant: Intel Corporation, Santa Clara, CA (US)

(72) Inventors: Christopher J. Jezewski, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 376 days.

(21) Appl. No.: 17/559,332

(22) Filed: Dec. 22, 2021

(65) Prior Publication Data

US 2023/0197823 A1     Jun. 22, 2023

(51) Int. Cl.
H10D 64/62          (2025.01)
H10D 30/01          (2025.01)
(Continued)

(52) U.S. Cl.
CPC ........... *H10D 64/62* (2025.01); *H10D 30/031* (2025.01); *H10D 30/6219* (2025.01); *H10D 30/6735* (2025.01); *H10D 30/6757* (2025.01); *H10D 62/118* (2025.01); *H10D 64/0116* (2026.01); *H10D 84/0167* (2025.01);
(Continued)

(58) Field of Classification Search
CPC ............. H10D 84/016; H10D 30/6219; H10D 84/853; H10D 30/024; H10D 62/83; H10D 62/12; H10D 64/021; H10D 84/017; H10D 84/85; H10D 64/60–62; H01L 21/76843;
(Continued)

(56) References Cited

U.S. PATENT DOCUMENTS 9,595,592 B1 * 3/2017 Ok ......................... H10D 64/62
2008/0237603 A1 * 10/2008 Lodha .................. H10D 84/038
                                                              29/842
(Continued)

FOREIGN PATENT DOCUMENTS

CN          110634866          12/2019

OTHER PUBLICATIONS

International Preliminary Report on Patentability from PCT/US2022/050713 notified Jul. 4, 2024, 7 pgs.
(Continued)

*Primary Examiner* — William B Partridge
*Assistant Examiner* — Alexandre X Ramirez
(74) *Attorney, Agent, or Firm* — Essential Patents Group, LLP

(57)          ABSTRACT

Complementary metal-oxide-semiconductor (CMOS) devices and methods related to selective metal contacts to n-type and p-type source and drain semiconductors are discussed. A p-type metal is deposited on n- and p-type source/drains. The p-type metal is selectively removed from the n-type source/drains but remains on dielectric materials adjacent the n-type source/drains. An n-type metal is deposited on the n-type source/drains while the remaining p-type metal seals the dielectric materials to protect the n-type metal from contamination. The n-type metal is then sealed using another p-type metal. A contact fill material contacts the resultant source and drain contact stacks.

21 Claims, 27 Drawing Sheets

(51) Int. Cl.

| | |
|---|---|
| *H10D 30/62* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |
| *H10P 14/20* | (2026.01) |
| *H10P 14/40* | (2026.01) |
| *H10P 50/26* | (2026.01) |

(52) U.S. Cl.
CPC ....... *H10D 84/0186* (2025.01); *H10D 84/038* (2025.01); *H10D 84/85* (2025.01); *H10P 14/3452* (2026.01); *H10P 14/418* (2026.01); *H10P 50/262* (2026.01)

(58) Field of Classification Search
CPC ........... H01L 21/28568; H01L 21/0259; H10P 14/3452
See application file for complete search history.

(56) References Cited

U.S. PATENT DOCUMENTS

| | | | |
|---|---|---|---|
| 2016/0104787 A1* | 4/2016 | Kittl | H10D 30/6219 |
| | | | 438/283 |
| 2017/0077032 A1 | 3/2017 | Lin et al. | |
| 2018/0226352 A1 | 8/2018 | Adusumilli et al. | |
| 2018/0286808 A1 | 10/2018 | You et al. | |
| 2020/0006159 A1* | 1/2020 | Shih | H01L 21/02532 |
| 2021/0225712 A1* | 7/2021 | Chu | H01L 21/76846 |
| 2021/0384192 A1 | 12/2021 | Bae et al. | |
| 2022/0102510 A1 | 3/2022 | Cook et al. | |
| 2022/0139900 A1* | 5/2022 | Oh | H10D 62/151 |
| | | | 257/351 |

OTHER PUBLICATIONS

International Search Report and Written Opinion from PCT/US2022/050713 notified Mar. 22, 2023, 10 pgs.

* cited by examiner

LOW RESISTANCE METAL TO SEMICONDUCTOR CONTACTS FOR INTEGRATED NMOS AND PMOS TRANSISTORS

BACKGROUND

High conductor and metal to semiconductor contact resistance in a transistor is undesirable because it reduces drive current and reduces efficiency, which degrades transistor performance. The interface between metal and semiconductor is an important source of undesired resistance through a transistor. Selecting the proper metal materials to decrease the resistance is not without issue. For example, in a complementary metal-oxide-semiconductor (CMOS) device, there are N-type source/drain regions and P-type source/drain regions. To minimize resistance in both conductivity types, different metal contacts to the N-type source/drain regions and P-type source/drain regions may be required. Current techniques for reducing contact resistance include selecting metals that have improved performance in PMOS (P-type metal-oxide-semiconductor) and NMOS (N-type metal-oxide-semiconductor) transistors and increasing the doping level of the semiconductor. However, such techniques have difficulties and drawbacks including requiring a compromise approach that degrades performance, inability to continue raising doping concentrations, and others.

It is with respect to these and other considerations that the present improvements have been needed. Such improvements may become critical as the need to increase transistor performance is needed to drive higher performance integrated circuit electronic devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

3

Figure 4:
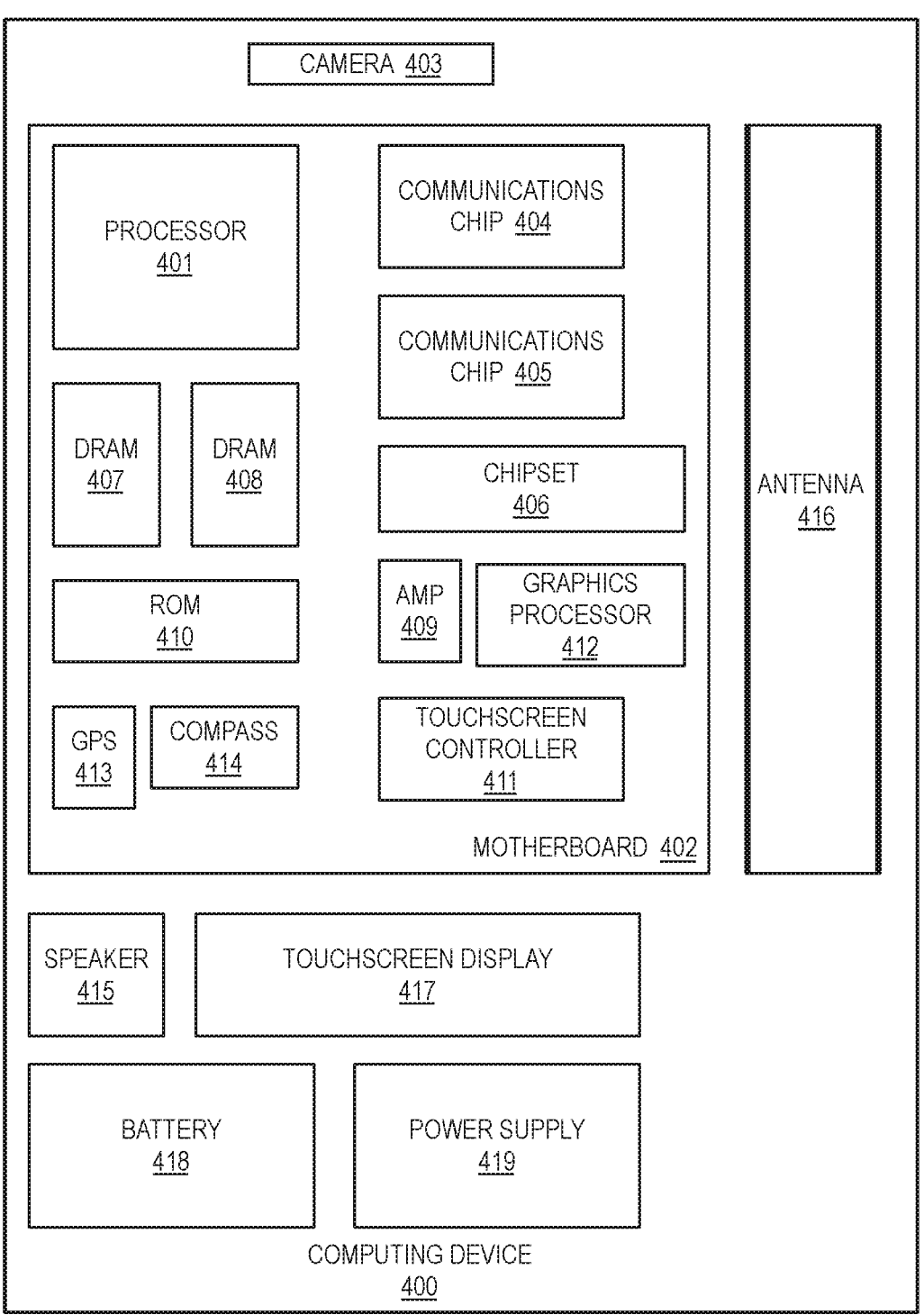

FIG. 4 is a functional block diagram of a computing device, all arranged in accordance with at least some implementations of the present disclosure.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

Transistors, integrated circuits, and techniques are described herein related to low contact resistance metal to semiconductor contacts for integrated PMOS and NMOS transistors.

As discussed, it is desirable to decrease contact resistance in transistors for improved drive current and efficiency in the resultant transistors. In some embodiments, techniques for using selective deposition and etch processes provide contaminant free low resistance metal to semiconductor contacts. Notably, using the discussed techniques, contact resistance can be reduced in contacting n-type and p-type source and drain semiconductor materials. Such contact to n-type may be made using low work function alkaline earth, lanthanides, and early transition metal contacts.

In some embodiments, a diffusion barrier material (e.g., a p-type metal) is deposited on both PMOS and NMOS source and drain regions. The diffusion barrier is selectively removed (e.g., etched) from the NMOS source and drain regions thereby exposing the bare semiconductor of the NMOS source and drain regions, and leaving all or a majority of insulating surfaces (e.g., dielectric materials including contaminants) covered by the diffusion barrier. A low contact resistance (Rc) N-type metal is then deposited on the remaining diffusion barrier and semiconductor source and drain surfaces. The diffusion barrier eliminates or reduces the amount of contaminates released during the N-type metal deposition from the dielectric materials to provide a high quality, low or no contaminant n-type metal contact. The diffusion barrier may be against any material or elements in any dielectric material such as oxygen, nitrogen, silicon, carbon, or others, which are described generally herein as contaminants. The term diffusion barrier indicates a layer that reduces or blocks such contaminants. Notably, absent the diffusion barrier, the n-type metal contact deposition would release contamination from the dielectric materials, causing the n-type metal, which is very contaminant sensitive, to be contaminated or poisoned during deposition thereby making the resultant material non-conductive. After contaminant free deposition of the n-type metal, a p-type metal cap is provided, optionally in the same vacuum to further eliminate contamination. The resultant structure, as metallized with conductor, provides a resultant stack of low Rc metal materials on both the PMOS and NMOS transistors. Finally, a layer of fill metal (e.g., a p-type metal fill) is deposited, providing a layer of p-type metal on PMOS transistors and a layer of n-type low Rc metal on NMOS transistors. Such techniques provide low contact resistance for both NMOS and PMOS transistors. For example, contact resistance is reduced in both PMOS and NMOS transistors by forming contacts with desirable metals for each doping type. The process advantageously requires only a single patterning step and integrates with vertical contact fill processing. The techniques discussed herein provide a process flow to form a Schottky contact using low contact resistance n-type metal with diffusion barrier plus p-type conductor on NMOS source and drains and p-type conductor on PMOS source and drains.

The techniques discussed herein may be implemented on any transistor architecture. In FIGS. 1A-1I, a tri-gate transistor architecture with optimized metal-semiconductor interfaces for the p-type and n-type source and drain regions is illustrated. In FIGS. 2A-2H, a gate-all-around (GAA) architecture with optimized metal-semiconductor interfaces for the P-type and N-type source/drain regions is illustrated. Such techniques may also be deployed in other transistor architectures inclusive of other multi-gate transistor architectures and planer transistor architectures.

Figure 1A:
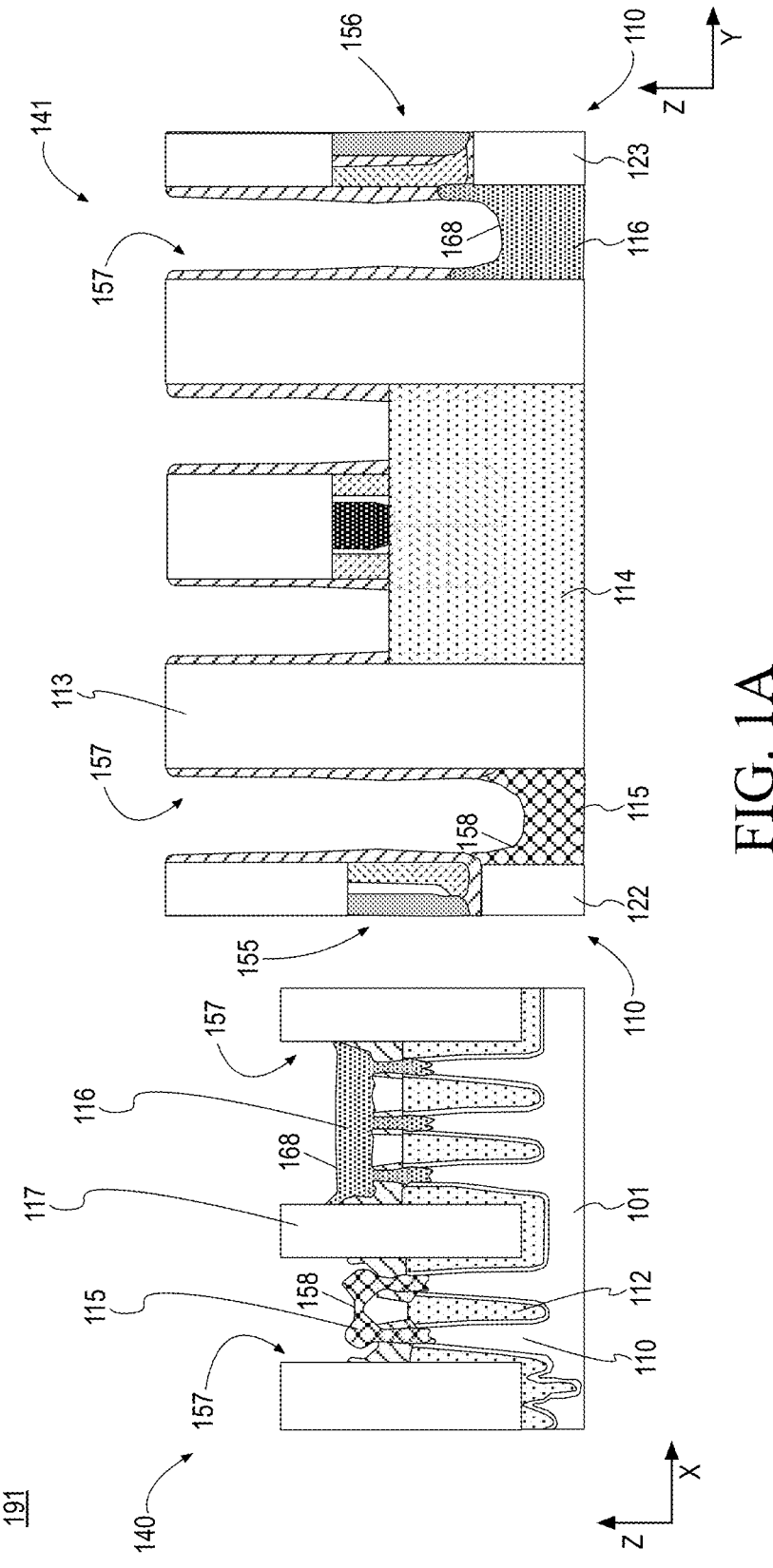
FIG. 1A illustrates cross-sectional views of a tri-gate device structure having exposed n-type source and drain regions and p-type source and drain regions.

FIG. 1A illustrates cross-sectional views of a tri-gate device structure 191 having exposed n-type source and drain regions and p-type source and drain regions, arranged in accordance with at least some implementations of the present disclosure. As used herein, the term device structure indicates any structure inclusive of devices that are completed or work in progress. A device structure may include one or more transistors or transistor structures. In FIG. 1A, cross-sectional view 140 provides a view taken at a fin cut centered on n-type source/drain region 115 and p-type source/drain region 116. As used herein, the term region indicates a body of material or a portion of a body of material. Cross-sectional view 141 provides a view taken at a poly cut (or gate cut) centered on a fin 110. Such cross-sectional views 140, 141 are also provided in FIGS. 1B-1I. Notably, n-type source/drain region 115 and p-type source/drain region 116 may be sources or drains with the other of such source or drain regions provided into or out of the page in cross-sectional view 140 or to the left or right of the view provided by cross-sectional view 141, as is known in the art. For example, device structure 191 may be provided subsequent to a trench etch to expose n-type source/drain region 115 and p-type source/drain region 116 (e.g., semiconductor contact regions).

As shown in cross-sectional view 141, n-type source/drain region 115 is adjacent to a channel region 122 (e.g., a part of fin 110). The other of the n-type source/drain region is on the opposite side of channel region 122 (i.e., in the negative y-direction in cross-sectional view 141) such that an NMOS transistor structure is eventually formed. Similarly, p-type source/drain region 116 is adjacent to a channel region 123 (e.g., a part of fin 110 or another fin). The other of the p-type source/drain region is on the opposite side of channel region 123 (i.e., in the positive y-direction in cross-sectional view 141) such that a PMOS transistor structure is eventually formed. In FIG. 1A, and the following FIGS. 1B-1I, gate structures 155, 156 are illustrated. Such gate structures 155, 156 may be final gate structures (e.g., having a gate dielectric on channel regions 122, 123 and a gate electrode on the gate dielectric layer) or they may be sacrificial gate structures that are replaced by final gate structures having a gate dielectric on channel regions 122, 123 and a gate electrode on the gate dielectric layer. Such structures and techniques are known in the art and are not discussed at length herein. Furthermore, the fabrication of device structure 191 is known in the art. The device structures and techniques discussed with respect to FIGS. 1A-1I provide CMOS transistor structures for integrated circuit devices.

As shown, fins 110 may be high aspect ratio fins that extend up from a substrate 101. Fins 110 and the substrate 101 may include a semiconductor material, such as silicon, or any other suitable semiconductor material. In some embodiments, fins 110 include germanium. In some embodiments, fins 110 include silicon and germanium. Fins 110 may have a tapered profile such that a bottom of fin 110 is wider than a top of the fin 110. In some embodiments, fins 110 may be formed over substrate 101 such that fins 110 and substrate 101 are discontinuous. Channel regions 122, 123 of fins 110 may be selectively doped to form NMOS and PMOS transistors using known techniques. NMOS transistors include an n-type source (i.e., n-type source/drain region 115), an n-type drain (i.e., n-type source/drain region 115), and a channel (i.e., channel region 122) with a gate structure to gate the channel. Similarly, PMOS transistors include a p-type source (i.e., p-type source/drain region 116), a p-type drain (i.e., p-type source/drain region 116), and a channel (i.e., channel region 123) with a gate structure to gate the channel.

Individual ones of fins 110 are separated by isolation material 112, which may be any suitable dielectric material or layer. In some embodiments, isolation material 112 may be recessed below a top of the fins 110.

N-type source/drain region 115 may include any suitable n-type semiconductor material such as silicon, germanium, or silicon and germanium doped with donor dopants such as one or more of phosphorous, arsenic, antimony, and bismuth. In some embodiments, n-type source/drain region 115 includes one of silicon, germanium, or silicon and germanium doped with phosphorous. In some embodiments, n-type source/drain region 115 includes one of silicon, germanium, or silicon and germanium doped with arsenic. In some embodiments, n-type source/drain region 115 includes one of silicon, germanium, or silicon and germanium doped with antimony. In some embodiments, n-type source/drain region 115 includes one of silicon, germanium, or silicon and germanium doped with bismuth. As discussed, multiple dopants may be used.

Similarly, p-type source/drain region 116 and may include any suitable p-type semiconductor material such as silicon, germanium, or silicon and germanium doped with acceptor dopants such as one or more of boron, gallium, or indium. In some embodiments, p-type source/drain region 116 includes one of silicon, germanium, or silicon and germanium doped with boron. In some embodiments, p-type source/drain region 116 includes one of silicon, germanium, or silicon and germanium doped with gallium. In some embodiments, p-type source/drain region 116 includes one of silicon, germanium, or silicon and germanium doped with indium. Multiple dopants may be deployed.

In some embodiments, n-type source/drain regions 115 and p-type source/drain region 116 are epitaxially grown semiconductor materials grown over a top surface of fins 110. In the case of multiple fins 110, n-type source/drain regions 115 may merge together to electrically couple multiple of fins 110 together, such as two fins as illustrated. Similarly, p-type source/drain regions 116 may merge to electrically couple others of fins 110, such as three fins as illustrated. N-type source/drain regions 115 and p-type source/drain region 116 may be separated by isolation material 114. Isolation material 114 may be any suitable insulator such as a filled trench that extends between the fins 110. Furthermore, isolation structures or materials 113, 117 (which may also be characterized as dielectric structures or materials) provide isolation between particular ones of fins 110. Isolation materials 113, 117 and other illustrated isolation structures provide electrical isolation between active components. In the illustrated example, isolation structure 113 includes a sidewall dielectric material and a bulk material. Such isolation materials may be any suitable insulative materials. For example, such isolation materials may be carbon-doped oxide, silicon nitride, silicon oxide, or other carbides or nitrides (e.g., silicon carbide, silicon nitride doped with carbon, or silicon oxynitride).

Notably, during metal deposition processing, exposed isolation materials may disadvantageously outgas or otherwise emit contaminates. Such contamination may come from any dielectric type inclusive of oxygen contamination, nitrogen contamination, silicon contamination, carbon contamination, or others. By substantially blocking such contaminations, the techniques discussed herein provide an interface that is doped epitaxial semiconductor to metal absent such contamination. It is noted that redistribution of p-type metal in similar small quantities does not cause an issue for the n-type metal resistance to epitaxial semiconductor.

Such contamination may cause difficulties during such metal deposition, particularly with respect to deposition of sensitive n-type metals. For example, isolation materials 113, 117 include a variety of surfaces inclusive of lateral or horizontal surfaces and sidewall surfaces such as sidewalls 157 that extend to a higher vertical position than that of top surface 158 of n-type source/drain region 115 and top surface 168 of p-type source/drain region 116. Using the techniques discussed herein, such surfaces are entirely or substantially covered during contaminant sensitive n-type metal deposition. For example, some of such surfaces are covered with a sealant or barrier (i.e., a p-type metal barrier) that eliminates or reduces contamination during such metal deposition processing to advantageously provide an contaminant free (or substantially contaminant free) n-type contact metal layer on n-type source/drain regions 115.

Figure 1B:
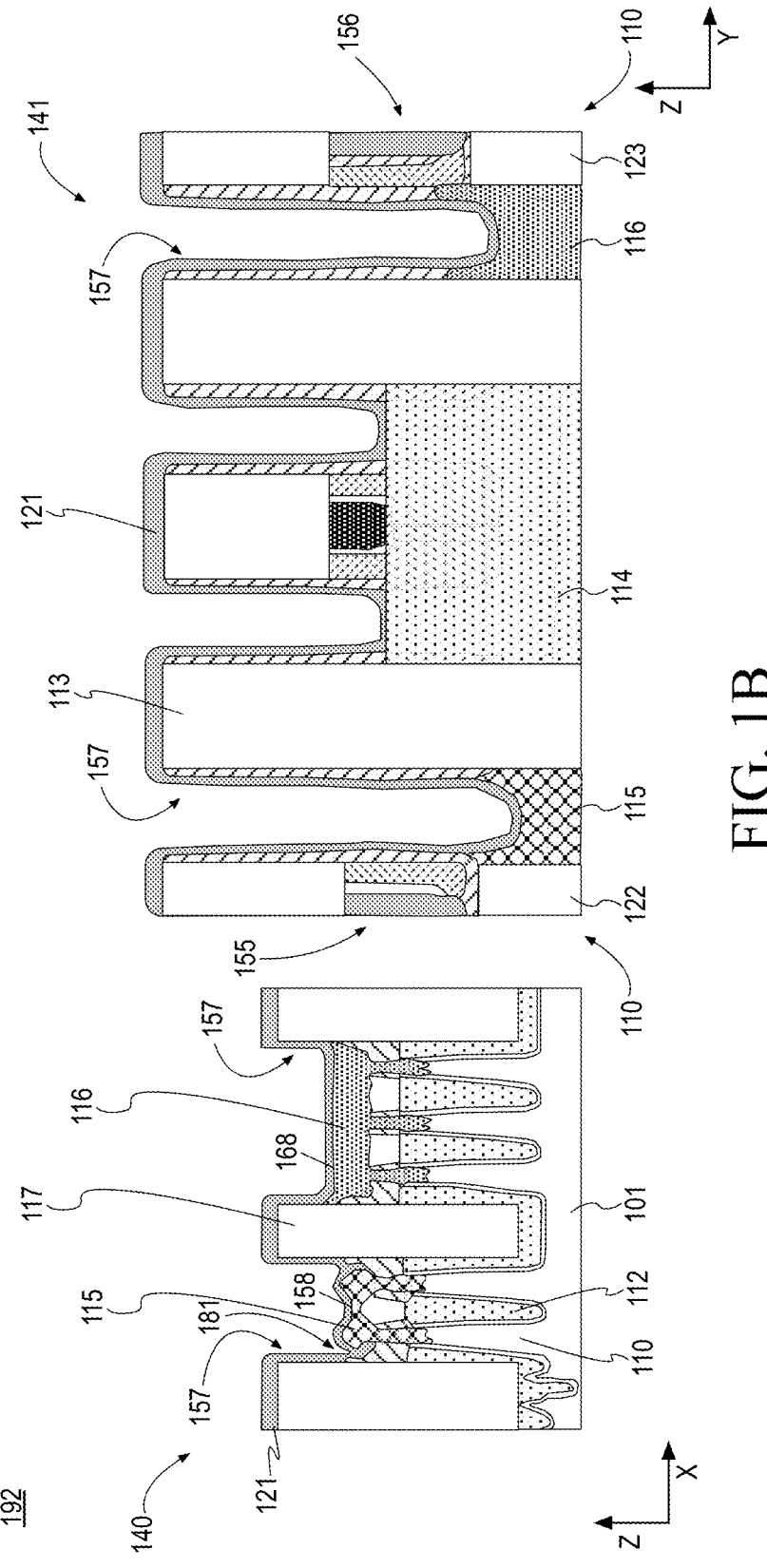
FIG. 1B illustrates cross-sectional views of a device structure similar to the device structure of FIG. 1A after a p-type metal layer is disposed over the n-type source/drain regions and the p-type source/drain regions.

FIG. 1B illustrates cross-sectional views of a device structure 192 similar to device structure 191 after a p-type metal layer 121 is disposed over n-type source/drain regions 115 and p-type source/drain regions 116, arranged in accordance with at least some implementations of the present disclosure. In some embodiments, the material of p-type metal layer 121 is selected such that it provides relatively low contact resistance to p-type source/drain regions 116. For example, the material of p-type metal layer 121 may be selected such that it provides relatively low contact resistance at the interface between p-type source/drain regions 116 and p-type metal layer 121. Furthermore, the material of p-type metal layer 121 may be selected such that it provides a diffusion barrier (or block off material) for dielectric materials adjacent n-type source/drain regions 115. In particular, the material of p-type metal layer 121 may be selected such that it provides a diffusion barrier (or block off material) for dielectric materials. For example, during contact to n-type source/drain regions 115, p-type metal layer 121 may remain on such dielectric materials and seal contaminates during such n-type metal deposition processing.

In some embodiments, p-type metal layer 121 is or includes one or more of tungsten, molybdenum, manganese, cobalt, nickel, ruthenium, rhenium, osmium, iridium, platinum, rhodium, or palladium. In some embodiments, p-type metal layer 121 is advantageously a liner material including one of molybdenum, manganese, cobalt, nickel, ruthenium, rhenium, osmium, iridium, platinum, rhodium, or palladium such that a later tungsten material fill may be deployed. P-type metal layer 121 may be deposited using any suitable technique or techniques. In some embodiments, p-type metal layer 121 is deposited using physical vapor deposition (PVD). In some embodiments, p-type metal layer 121 is deposited using sputter techniques. In some embodiments, p-type metal layer 121 is deposited using atomic layer deposition (ALD). In some embodiments, p-type metal layer 121 is deposited using chemical vapor deposition (CVD).

P-type metal layer 121 may be deposited to any suitable thickness such as a thickness in the range of 0.5 nm to 10 nm. In some embodiments, p-type metal layer 121 has a thickness in the range of 2 nm to 6 nm. In some embodiments, p-type metal layer 121 has a thickness in the range of 1 nm to 4 nm. In examples where PVD, sputter, or CVD techniques are used, a thickness of p-type metal layer 121 on horizontal surfaces may be greater than that of a thickness of p-type metal layer 121 on vertical surfaces (e.g., about 1 nm to 2 nm thicker on horizontal surfaces). In examples where ALD techniques are used, thicknesses on horizontal and vertical surfaces may be substantially the same.

As shown in FIG. 1B, p-type metal layer 121 is formed on n-type source/drain regions 115 (e.g., including an n-type semiconductor material), p-type source/drain region 116 (e.g., including a p-type semiconductor material), and isolation structures or materials 113, 117 (e.g., dielectric materials such as oxide dielectric materials). As used herein, the term oxide dielectric material indicates a dielectric material including oxygen. Exemplary oxide dielectric materials include silicon oxide, silicon oxides including dopants or other materials, silicon oxynitride, and silicon oxycarbide. However, any dielectric material may be deployed. Although illustrated as a full blanket deposition of p-type metal layer 121, in some embodiments, discontinuities may be observed in p-type metal layer 121 such as at a pinch point or cavity 181.

Figure 1C:
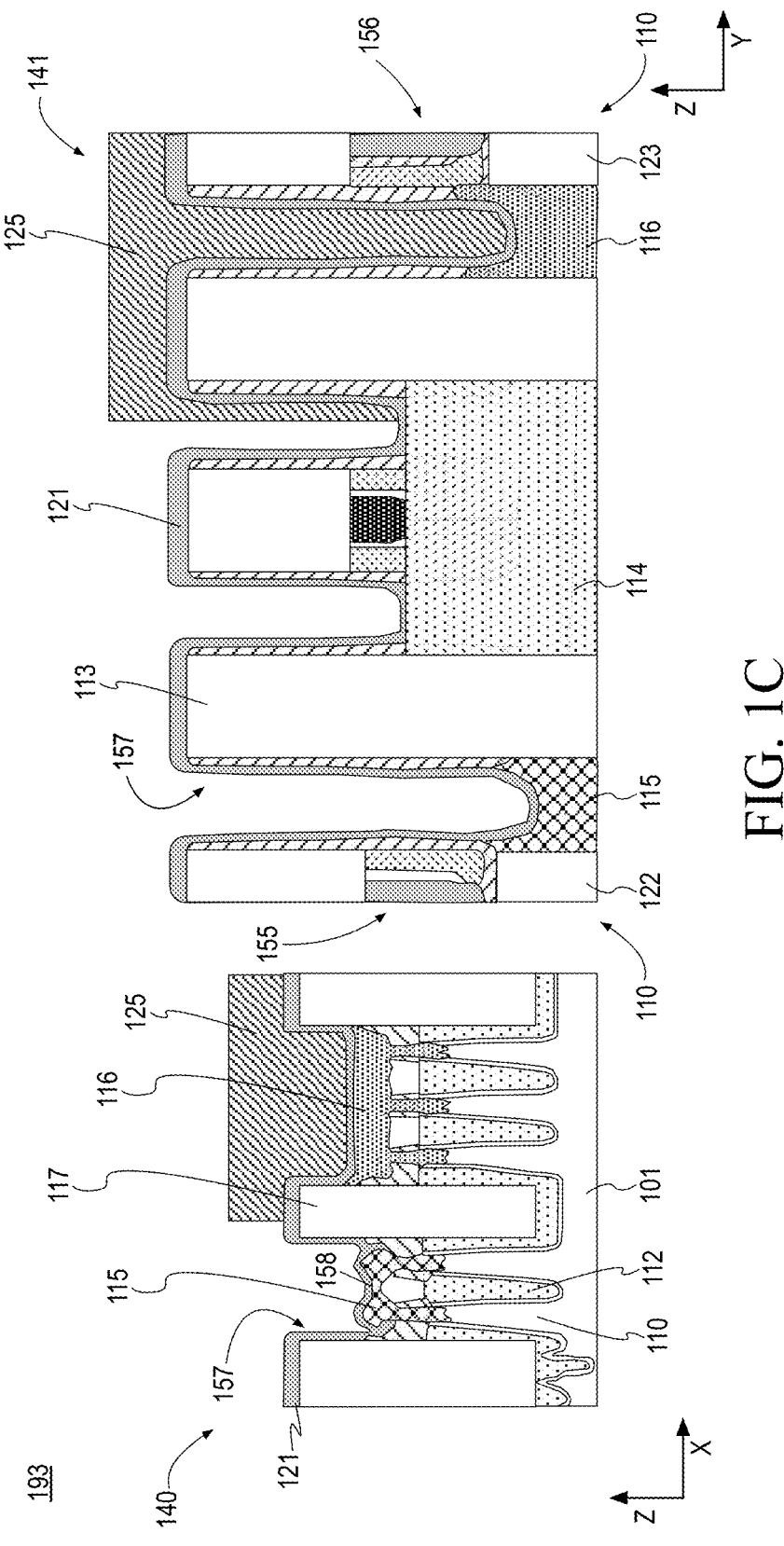
FIG. 1C illustrates cross-sectional views of a device structure similar to the device structure of FIG. 1B after formation of a mask layer that covers the p-type metal layer over the p-type source/drain regions and exposes the p-type metal layer over the n-type source/drain regions.

FIG. 1C illustrates cross-sectional views of a device structure 193 similar to device structure 192 after formation of a mask layer 125 that covers p-type metal layer 121 over p-type source/drain regions 116 and exposes p-type metal layer 121 over n-type source/drain regions 115, arranged in accordance with at least some implementations of the present disclosure. Mask layer 125 may be any suitable material such as a carbon hardmask or the like. In some embodiments, a bulk material layer is provided and the bulk material layer is patterned using lithography processing to form mask layer 125. Such lithography processing is used to expose p-type metal layer 121 over n-type source/drain regions 115 and adjacent regions and to mask p-type metal layer 121 over p-type source/drain regions 116 and adjacent regions. As shown in FIG. 1C, mask layer 125 masks p-type source/drain regions 116 (e.g., such p-type source/drain regions 116 are under mask layer 125) and exposes n-type source/drain regions 115 (e.g., such n-type source/drain regions 115 are under openings in mask layer 125).

Figure 1D:
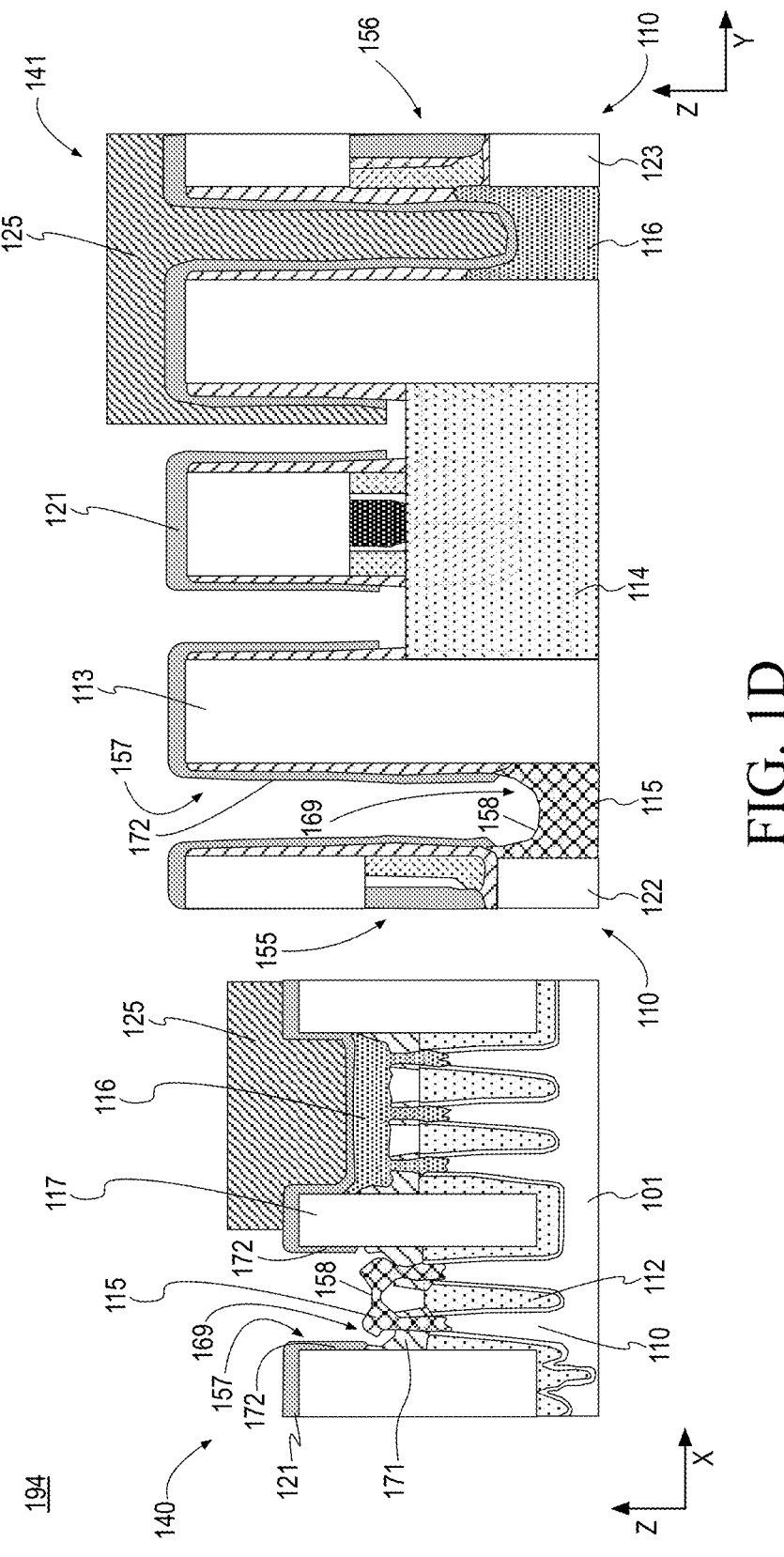
FIG. 1D illustrates cross-sectional views of a device structure similar to the device structure of FIG. 1C after removal of portions of the p-type metal layer.

FIG. 1D illustrates cross-sectional views of a device structure 194 similar to device structure 193 after removal of portions 169 of p-type metal layer 121, arranged in accordance with at least some implementations of the present disclosure. As shown, removal of portions 169 provides for exposure of n-type source/drain regions 115 inclusive of top surfaces 158 of n-type source/drain regions 115. Removal of portions 169 of p-type metal layer 121 may also expose surfaces of dielectric material 171. Notably, removal of portions 169 of p-type metal layer 121 leaves isolation materials 113, 117, inclusive of sidewalls 157 of isolation materials 113, 117 covered with portions 172 of p-type metal layer 121. In some embodiments, such dielectric and isolation materials may be fully covered by remaining portions 172 of p-type metal layer 121 (i.e., a barrier layer). However, even in contexts where some portions of such dielectric and isolation materials are exposed, the surface area of such exposure is dramatically reduced by remaining portions 172 of p-type metal layer 121.

Portions 169 of p-type metal layer 121 may be removed using any suitable technique or techniques. In some embodiments, portions 169 of p-type metal layer 121 are removed using a normal incidence etch such as a sputter etch. In some embodiments, portions 169 of p-type metal layer 121 are removed using an argon etch where a plasma of argon ions is formed and biased to a normal incidence on the device structure (i.e., normal to the x-y plane). In some embodiments, the sputter etch is performed using a PVD tool. As shown, in some embodiments, such normal incidence etch processing removes portions 169 of p-type metal layer 121 more rapidly within the features of n-type source/drain regions 115 and the features around n-type source/drain regions 115. In such examples, portions of p-type metal layer 121 remain on the top surfaces of isolation materials 113, 117. In other examples, portions of p-type metal layer 121 may be removed from the top surfaces of isolation materials 113, 117. Such techniques provide selective etch of the p-type metal from the NMOS semiconductor material at the bottom the contacts.

As shown in FIG. 1D, a portion or portions 169 of p-type metal layer 121 are selectively removed from n-type source/drain regions 115 such that a portion or portions 172 of p-type metal layer 121 remains on an oxide dielectric material sidewall (i.e., sidewalls 157 of isolation structures or materials 113, 117) after the selective removal of portion or portions 169 of p-type metal.

Figure 1E:
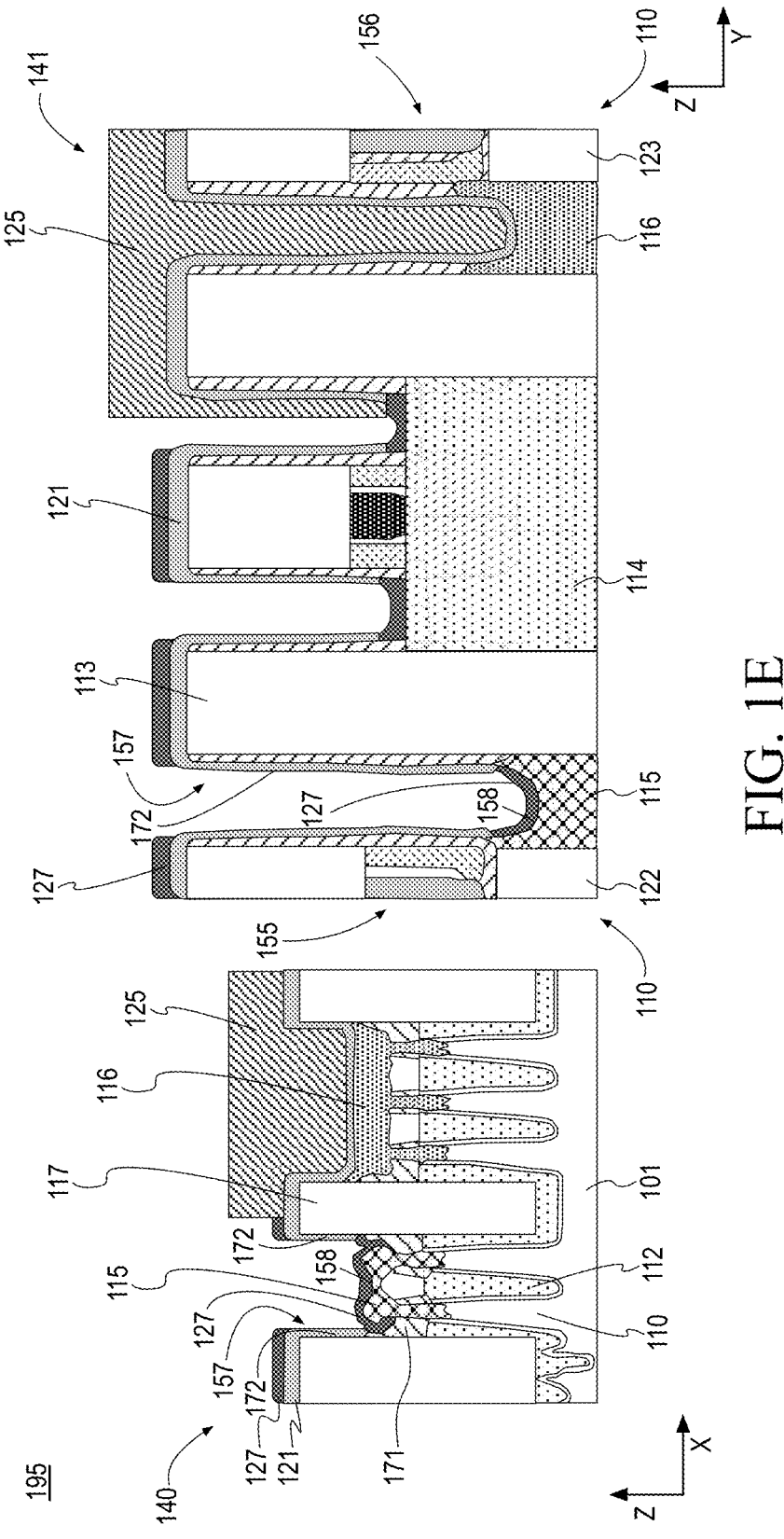
FIG. 1E illustrates cross-sectional views of a device structure similar to the device structure of FIG. 1D after an n-type metal layer is disposed selectively on the n-type source/drain regions.

FIG. 1E illustrates cross-sectional views of a device structure 195 similar to device structure 194 after an n-type metal layer 127 is disposed selectively on n-type source/drain regions 115, arranged in accordance with at least some implementations of the present disclosure. In some embodiments, the material of n-type metal layer 127 is selected such that it provides relatively low contact resistance to n-type source/drain regions 115. For example, the material of n-type metal layer 127 may be selected such that it provides relatively low contact resistance at the interface between n-type source/drain regions 115 and n-type metal layer 127. As shown, in some embodiments, n-type metal layer 127 is not formed on mask layer 125 nor on portions 172 of p-type metal layer 121 that are on sidewalls 157 of isolation materials 113, 117. In some embodiments, n-type metal layer 127 may be formed on one or both of mask layer 125 or portions 172.

Notably, portions 172 of p-type metal layer 121 provide a contamination barrier during the formation of n-type metal layer 127, which would otherwise be very sensitive to such contamination from isolation materials 113, 117 and other exposed dielectric materials. It is noted that some dielectric materials such as dielectric material 171 may be exposed during such deposition, but the reduction in exposure is such that n-type metals that maintain low resistance may be successfully deposited. In some embodiments, during deposition of n-type metal layer 127, a lateral surface of an oxide dielectric material (e.g., dielectric material 171 or other dialectic or isolation material) may be exposed.

The discussed techniques enable the use of a variety of n-type metal materials that would otherwise be unusable due to contamination. Such n-type metal materials that may be used include the lanthanides (i.e., Ce, Pr, Nd, Pm, SM, Eu, Gd, Tb, Dy, Ho, Er, Tm, Yb, Lu), alkaline earth metals (i.e., Mg, Ca, Sr, Ba), and early transition metals (i.e., Sc, Y, La, Ti, Zr, Hf). In some embodiments, n-type metal layer 127 is or includes one or more of cerium, praseodymium, neodymium, promethium, samarium, europium, gadolinium, terbium, dysprosium, holmium, erbium, thulium, ytterbium, or lutetium. In some embodiments, n-type metal layer 127 is or includes one or more of magnesium, calcium, strontium, or barium. In some embodiments, n-type metal layer 127 is or includes one or more of scandium, yttrium, lanthanum, titanium, zirconium, or hafnium. In some embodiments, n-type metal layer 127 is or includes one or more of cerium, praseodymium, neodymium, promethium, samarium, europium, gadolinium, terbium, dysprosium, holmium, erbium, thulium, ytterbium, lutetium. magnesium, calcium, strontium, barium, scandium, yttrium, lanthanum, titanium, zirconium, or hafnium. Combinations of such metals may be used.

N-type metal layer 127 may be deposited using any suitable technique or techniques. In some embodiments, n-type metal layer 127 is deposited using PVD. In some embodiments, n-type metal layer 127 is deposited using ALD. In some embodiments, n-type metal layer 127 is deposited using CVD. N-type metal layer 127 may be deposited to any suitable thickness such as a thickness in the range of 0.5 nm to 10 nm. In some embodiments, n-type metal layer 127 has a thickness in the range of 2 nm to 6 nm. In some embodiments, n-type metal layer 127 has a thickness in the range of 1 nm to 4 nm.

As shown in FIG. 1E, n-type metal layer 127 is formed on n-type source/drain regions 115 but not on p-type source/drain regions 116 due to mask 125. Furthermore, isolation structures or materials 113, 117 (e.g., dielectric materials such as oxide dielectric materials) are largely protected during the deposition of n-type metal layer 127. For example, the process discussed herein provides for selective deposition of n-type metal layer 127 on n-type source/drain regions 115.

Figure 1F:
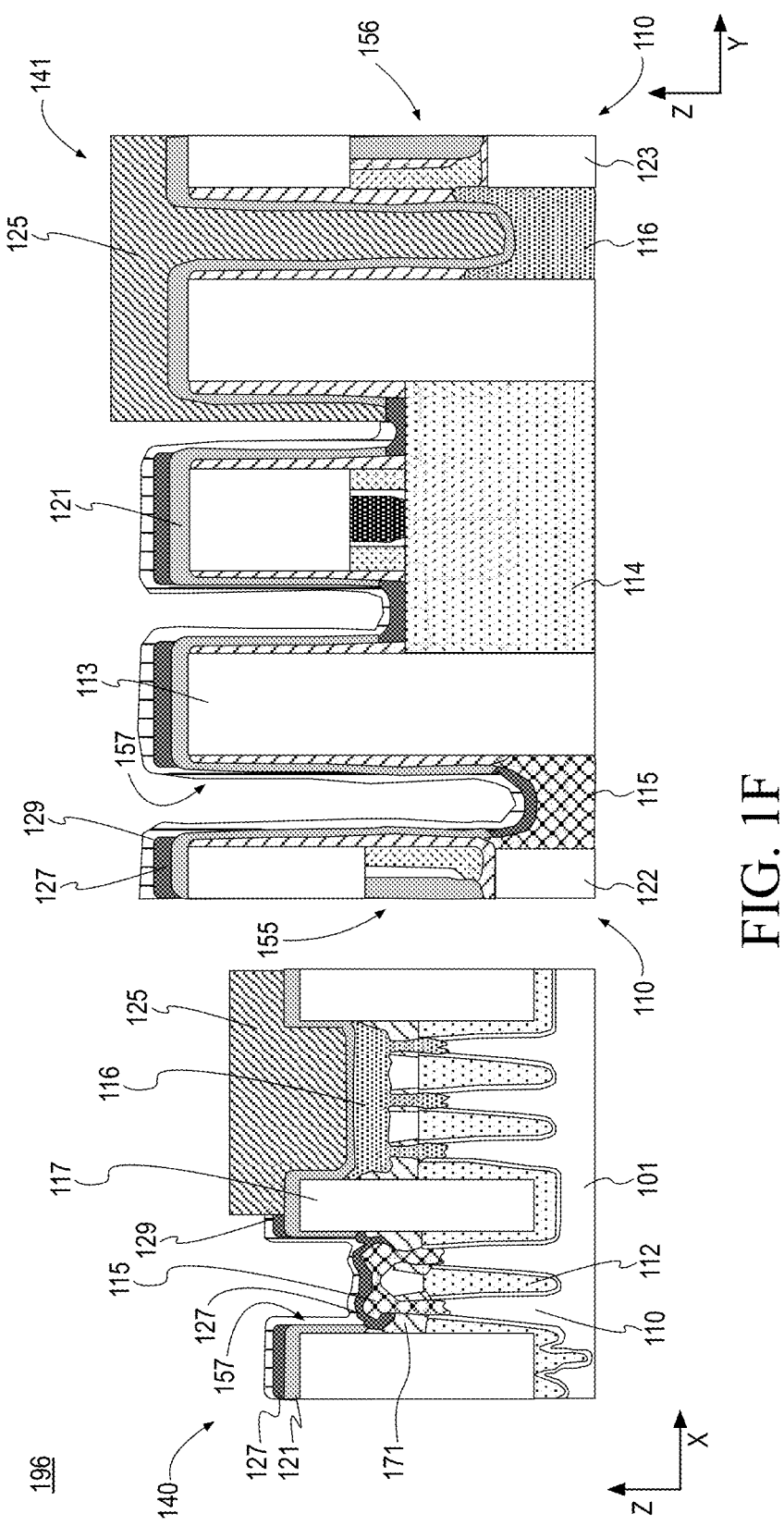
FIG. 1F illustrates cross-sectional views of a device structure similar to the device structure of FIG. 1E after a p-type metal layer is disposed on the n-type metal layer.

FIG. 1F illustrates cross-sectional views of a device structure 196 similar to device structure 195 after a p-type metal layer 129 is disposed on n-type metal layer 127, arranged in accordance with at least some implementations of the present disclosure. In some embodiments, the material of p-type metal layer 129 is selected such that encapsulates n-type metal layer 127 to again provide a diffusion barrier (or block off material or cap) for n-type metal layer 127. In particular, the material of p-type metal layer 129 may be selected such that it provides a diffusion barrier (or block off material) for diffusion of contaminants. In some embodiments, n-type metal layer 127 and p-type metal layer 129 are deposited using operations performed in the same vacuum chamber without vacuum release therebetween. Using such techniques, n-type metal layer 127 is advantageously not exposed to an environment including contaminants. In other embodiments, n-type metal layer 127 may be exposed only to an inert environment such as a noble gas environment prior to application of p-type metal layer 129.

P-type metal layer 129 may include any material discussed with respect to p-type metal layer 121. In some embodiments, p-type metal layer 129 is or includes one or more of tungsten, molybdenum, manganese, cobalt, nickel, ruthenium, rhenium, osmium, iridium, platinum, rhodium, or palladium. In some embodiments, p-type metal layer 129 is advantageously a liner material including one of molybdenum, manganese, cobalt, nickel, ruthenium, rhenium, osmium, iridium, platinum, rhodium, or palladium such that a later tungsten material fill may be deployed. In some embodiments, p-type metal layer 129 is advantageously a material other than that of p-type metal layer 121. For example, p-type metal layer 129 may be one of molybdenum, manganese, cobalt, nickel, ruthenium, rhenium, osmium, iridium, platinum, rhodium, or palladium while p-type metal layer 121 may be another of molybdenum, manganese, cobalt, nickel, ruthenium, rhenium, osmium, iridium, platinum, rhodium, or palladium. In some embodiments, p-type metal layer 129 and p-type metal layer 121 are different p-type metal materials.

P-type metal layer 129 may be deposited using any suitable technique or techniques. In some embodiments, p-type metal layer 129 is deposited using PVD. In some embodiments, p-type metal layer 129 is deposited using sputter techniques. In some embodiments, p-type metal layer 129 is deposited using ALD. In some embodiments, p-type metal layer 129 is deposited using CVD. P-type metal layer 129 may be deployed at any suitable thickness such as a thickness in the range of 0.5 nm to 15 nm, a thickness in the range of 2 nm to 10 nm, or a thickness in the range of 1 nm to 6 nm.

As shown in FIG. 1F, p-type metal layer 129 is selective deposited on n-type metal layer 127 to provide a contaminant barrier. In some embodiments, as shown, p-type metal layer 129 is deposited over sidewalls 157 (i.e., on p-type metal layer 121). In other embodiments, p-type metal layer 129 is not formed over such sidewalls 157 but is instead selectively formed over the portion of n-type metal layer 127 that is on n-type source/drain regions 115.

Figure 1G:
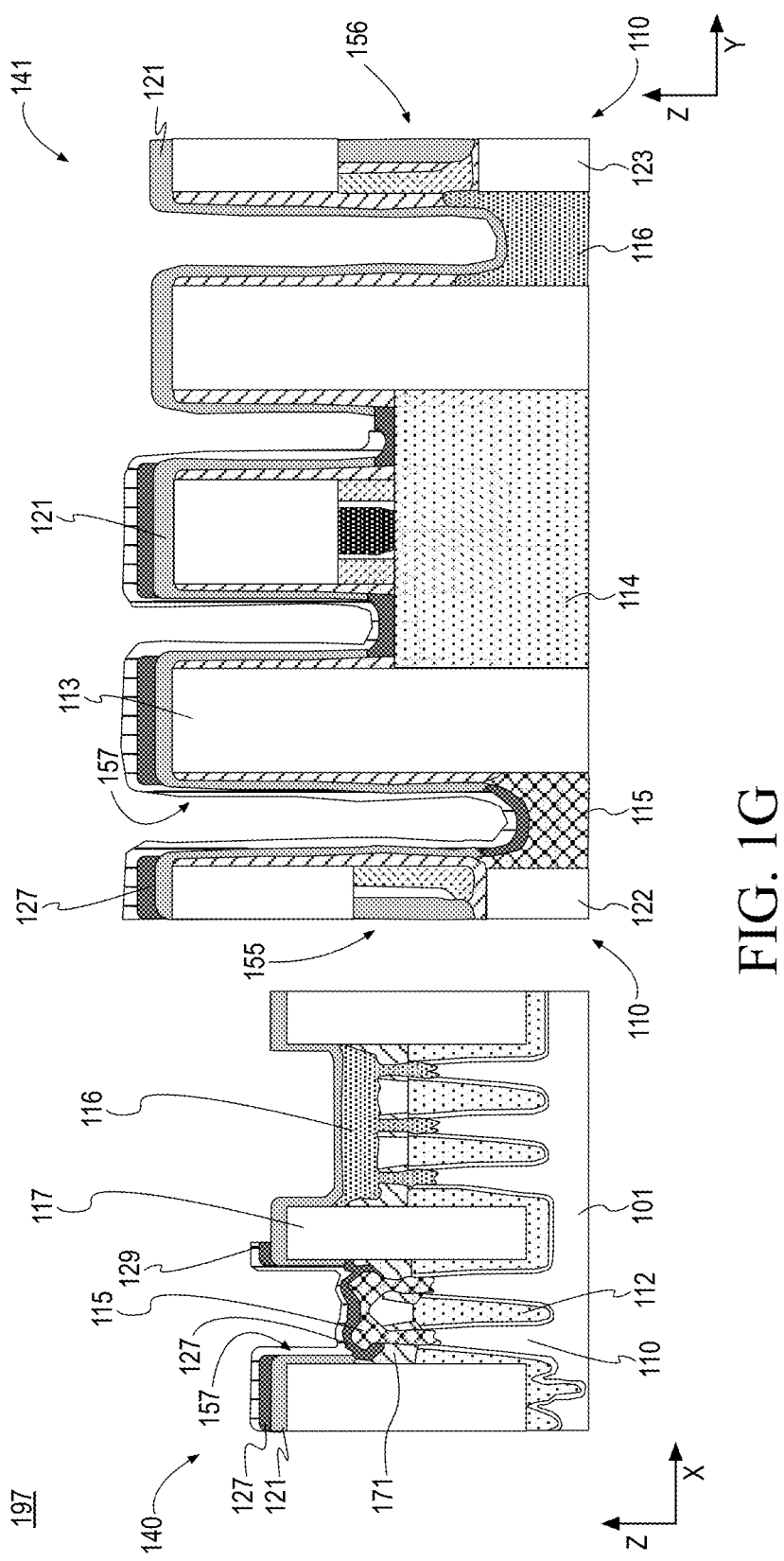
FIG. 1G illustrates cross-sectional views of a device structure similar to the device structure of FIG. 1F after removal of the mask layer.

FIG. 1G illustrates cross-sectional views of a device structure 197 similar to device structure 196 after removal of mask layer 125, arranged in accordance with at least some implementations of the present disclosure. Mask layer 125 may be removed using any suitable technique or techniques. In some embodiments, mask layer 125 is removed by an ashing process to ash a carbon hardmask or similar material. As shown, removal of mask layer 125 exposes the portion of p-type metal layer 121 over p-type source/drain regions 116. Notably, p-type metal layer 121 (e.g., tungsten, molybdenum, manganese, cobalt, nickel, ruthenium, rhenium, osmium, iridium, platinum, rhodium, or palladium) provides a low resistance contact for p-type source/drain regions 116.

Figure 1H:
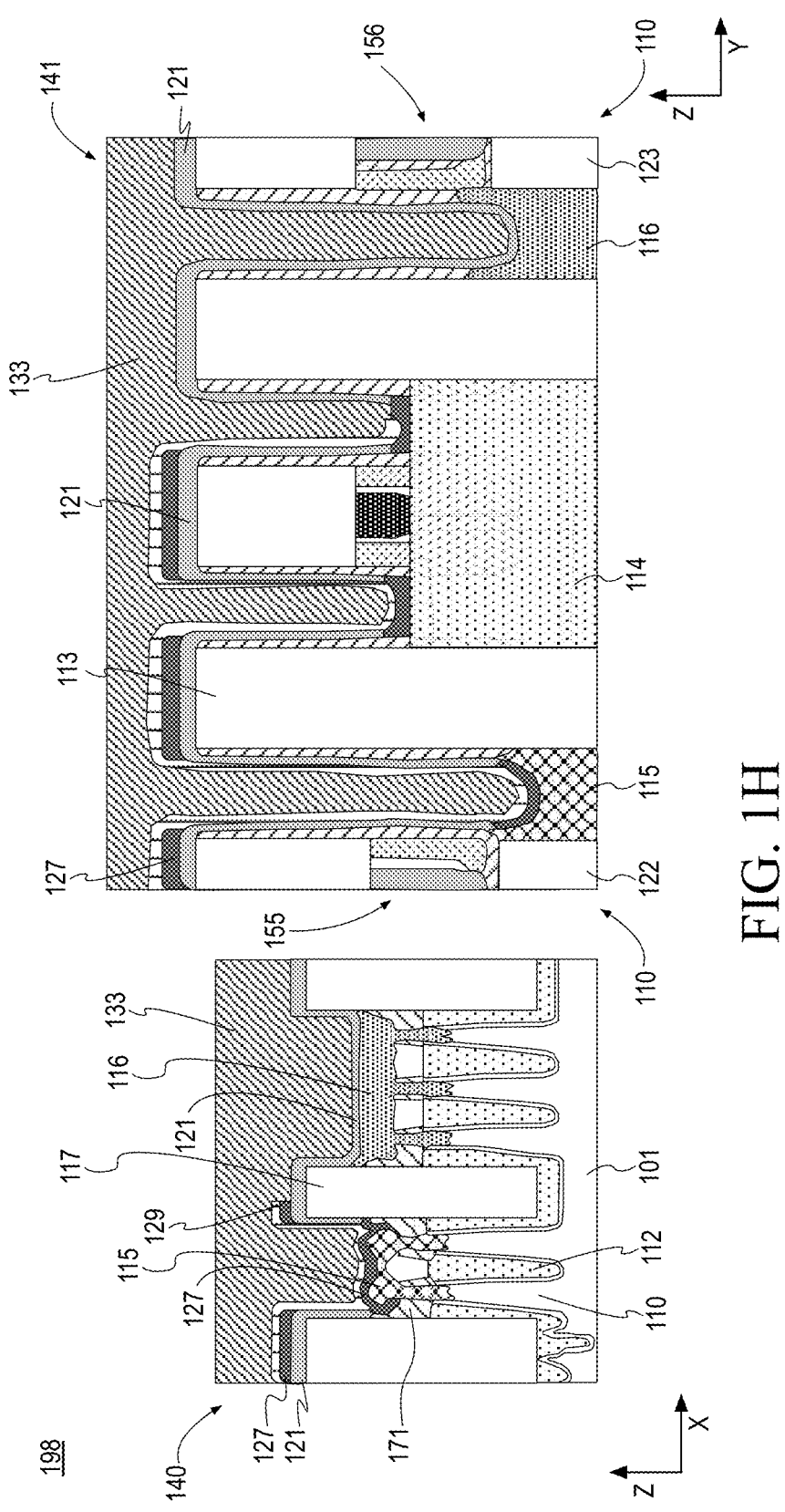
FIG. 1H illustrates cross-sectional views of a device structure similar to the device structure of FIG. 1G after formation of a contact fill metal.

FIG. 1H illustrates cross-sectional views of a device structure 198 similar to device structure 197 after formation of a contact fill metal 133, arranged in accordance with at least some implementations of the present disclosure. Contact fill metal 133 may be formed using any suitable technique or techniques. In some embodiments, contact fill metal 133 is deposited via CVD or ALD processing or the like. Contact fill metal 133 may be selected to provide relatively low contact resistance to both p-type metal layer 121 and p-type source/drain regions 116 as well as the metal stack of n-type metal layer 127 and p-type metal layer 129 and n-type source/drain regions 115. In some embodiments, contact fill metal 133 is a p-type metal such as tungsten, molybdenum, manganese, cobalt, nickel, ruthenium, rhenium, osmium, iridium, platinum, rhodium, or palladium. In some embodiments, contact fill metal 133 is tungsten and p-type metal layers 121, 129 are a p-type metal material or materials other than tungsten.

Figure 1I:
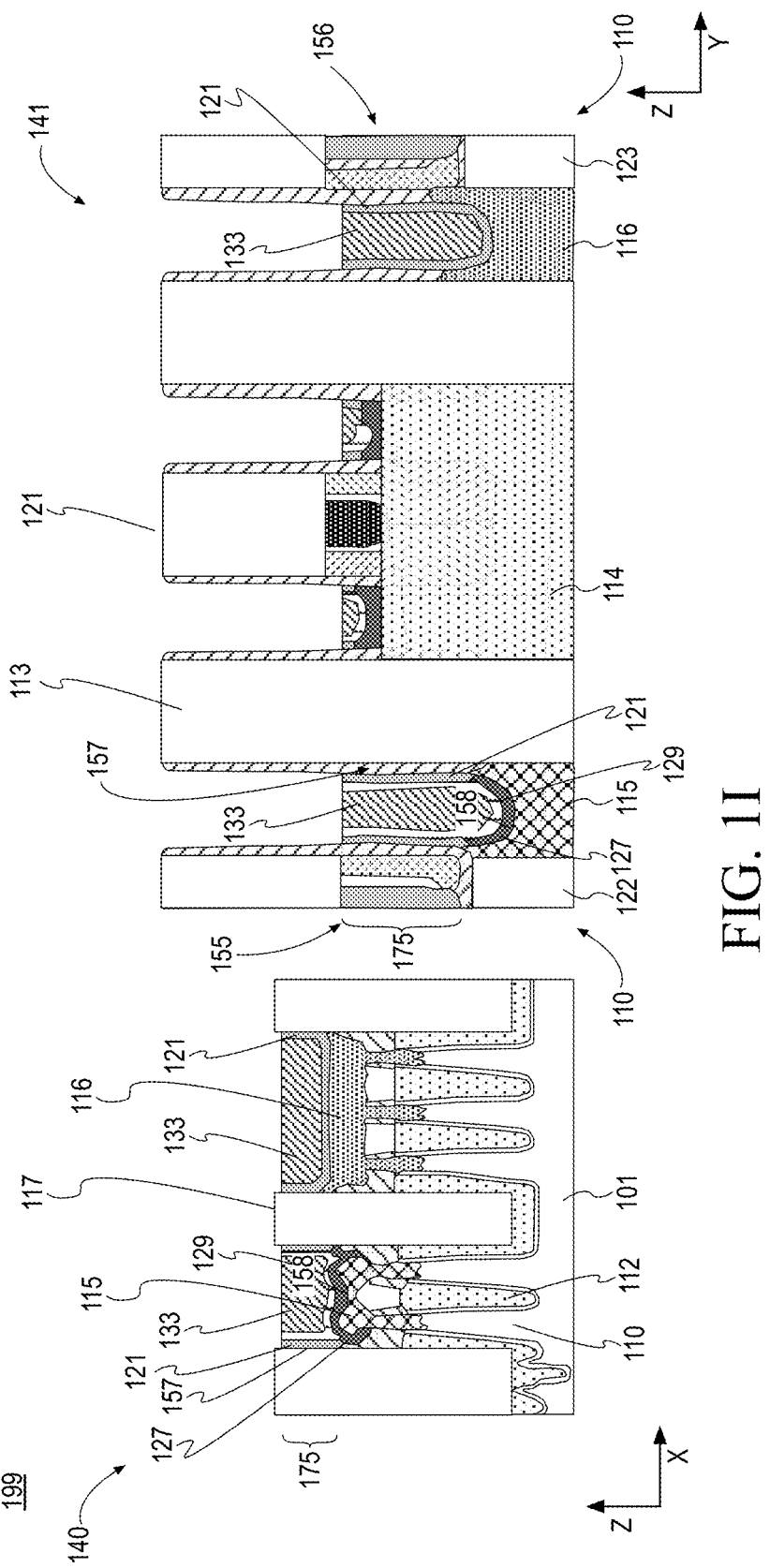
FIG. 1I illustrates cross-sectional views of a device structure similar to the device structure of FIG. 1H after recessing the contact fill metal.

FIG. 1I illustrates cross-sectional views of a device structure 199 similar to device structure 198 after recessing contact fill metal 133, arranged in accordance with at least some implementations of the present disclosure. For example, such recessing processing may be included when the CMOS device is a self aligned gate electrode (SAGE) type structure. Such recessing may recess contact fill metal 133 below a SAGE wall and remove residual metals. Such processing may not be necessary in SAGE-less process flows. Further processing may include replacement gate operations (e.g., to form gate structures inclusive of gate dielectric and gate electrode or contact), contacting such gate contacts as well as contact fill metal 133 using vias and metallization layers, and so on. For example, device structure 199 may provide a CMOS device.

FIGS. 1A-1I illustrate exemplary processing operations inclusive of applying n-type metal 127 and p-type metal 129 with mask 125 in place, removing mask 125 and then providing fill metal 133. FIGS. 1J-1M illustrate exemplary processing operations inclusive of first removing mask 125, then applying n-type metal 127 and p-type metal 129, and subsequent providing fill metal 133. After the processing illustrated by FIG. 1M, recess processing as discussed with respect to FIG. 1I may then be performed.

Figure 1J:
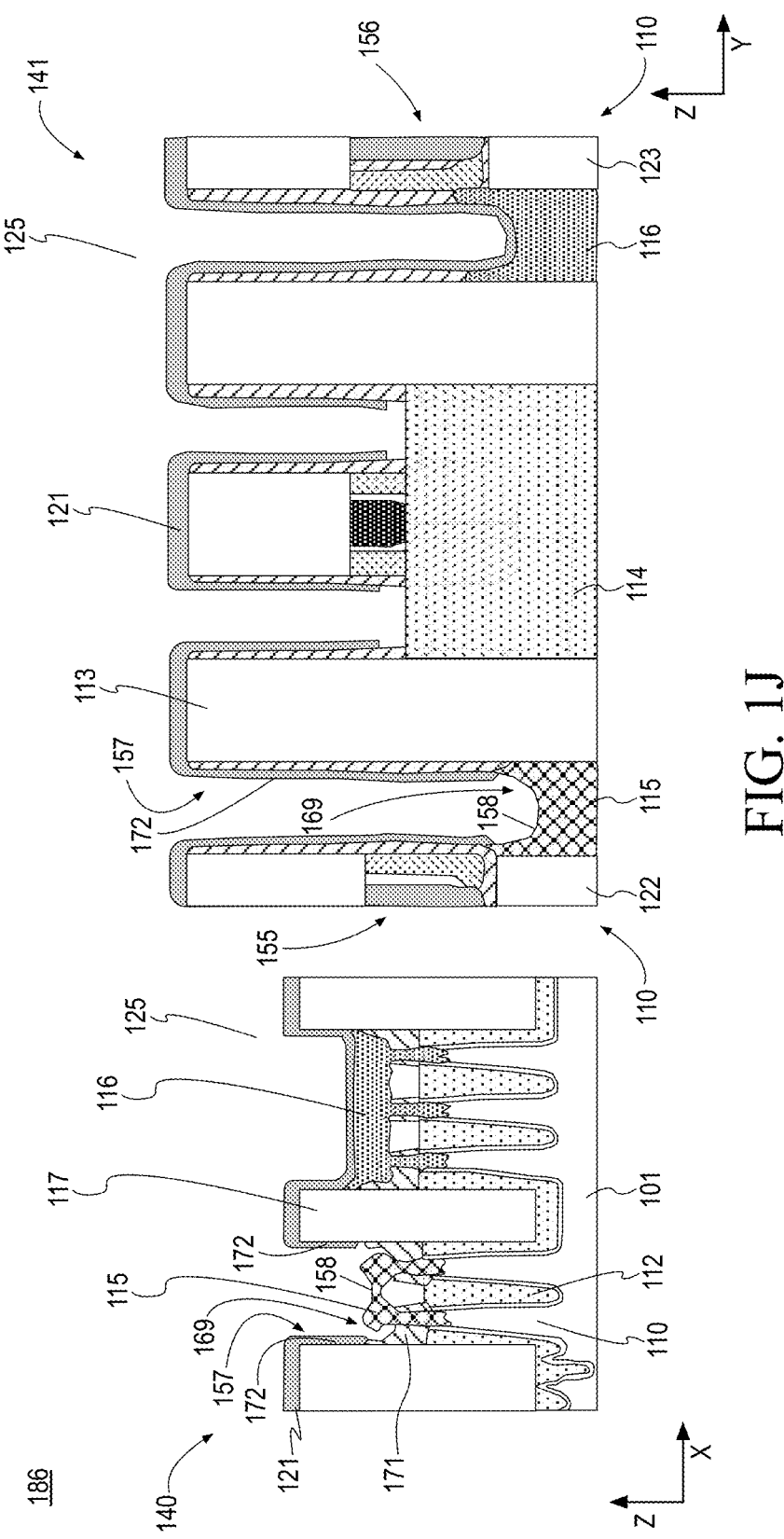
FIG. 1J illustrates cross-sectional views of a device structure similar to the device structure of FIG. 1D after removal of the mask layer.

FIG. 1J illustrates cross-sectional views of a device structure 186 similar to device structure 194 (refer to FIG. 1D) after removal of mask layer 125, arranged in accordance with at least some implementations of the present disclosure. Mask layer 125 may be removed using any suitable technique or techniques such as an ashing process to ash a carbon hardmask or similar material. As shown, removal of mask layer 125 exposes the portion of p-type metal layer 121 over p-type source/drain regions 116. Notably, p-type metal layer 121 (e.g., tungsten, molybdenum, manganese, cobalt, nickel, ruthenium, rhenium, osmium, iridium, platinum, rhodium, or palladium) provides a low resistance contact for p-type source/drain regions 116.

Figure 1K:
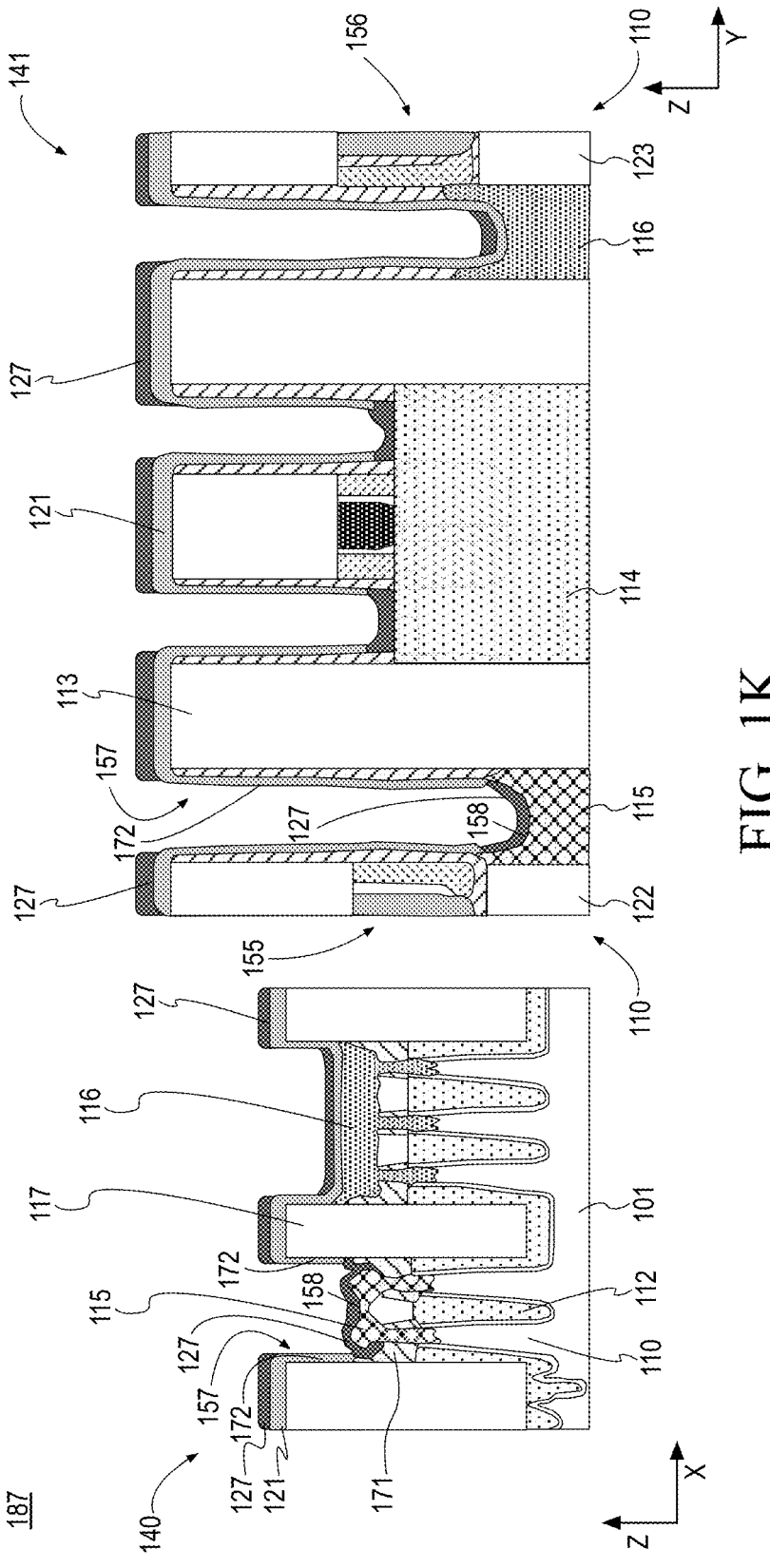
FIG. 1K illustrates cross-sectional views of a device structure similar to the device structure of FIG. 1J after an n-type metal layer is bulk disposed on the n-type source/drain regions and the p-type metal layer.

FIG. 1K illustrates cross-sectional views of a device structure 187 similar to device structure 186 after an n-type metal layer 127 is bulk disposed on n-type source/drain regions 115 and p-type metal layer 121, arranged in accordance with at least some implementations of the present disclosure. In some embodiments, the material of n-type metal layer 127 is selected such that it provides relatively low contact resistance to n-type source/drain regions 115, and n-type metal layer 127 may be any n-type metal discussed herein. Furthermore, portions 172 of p-type metal layer 121 provide a contamination barrier during the formation of n-type metal layer 127. N-type metal layer 127 may be deposited using any suitable technique or techniques such as PVD, ALD, CVD to any suitable thickness such as a thickness in the range of 0.5 nm to 10 nm, a thickness in the range of 2 nm to 6 nm, or a thickness in the range of 1 nm to 4 nm.

Figure 1L:
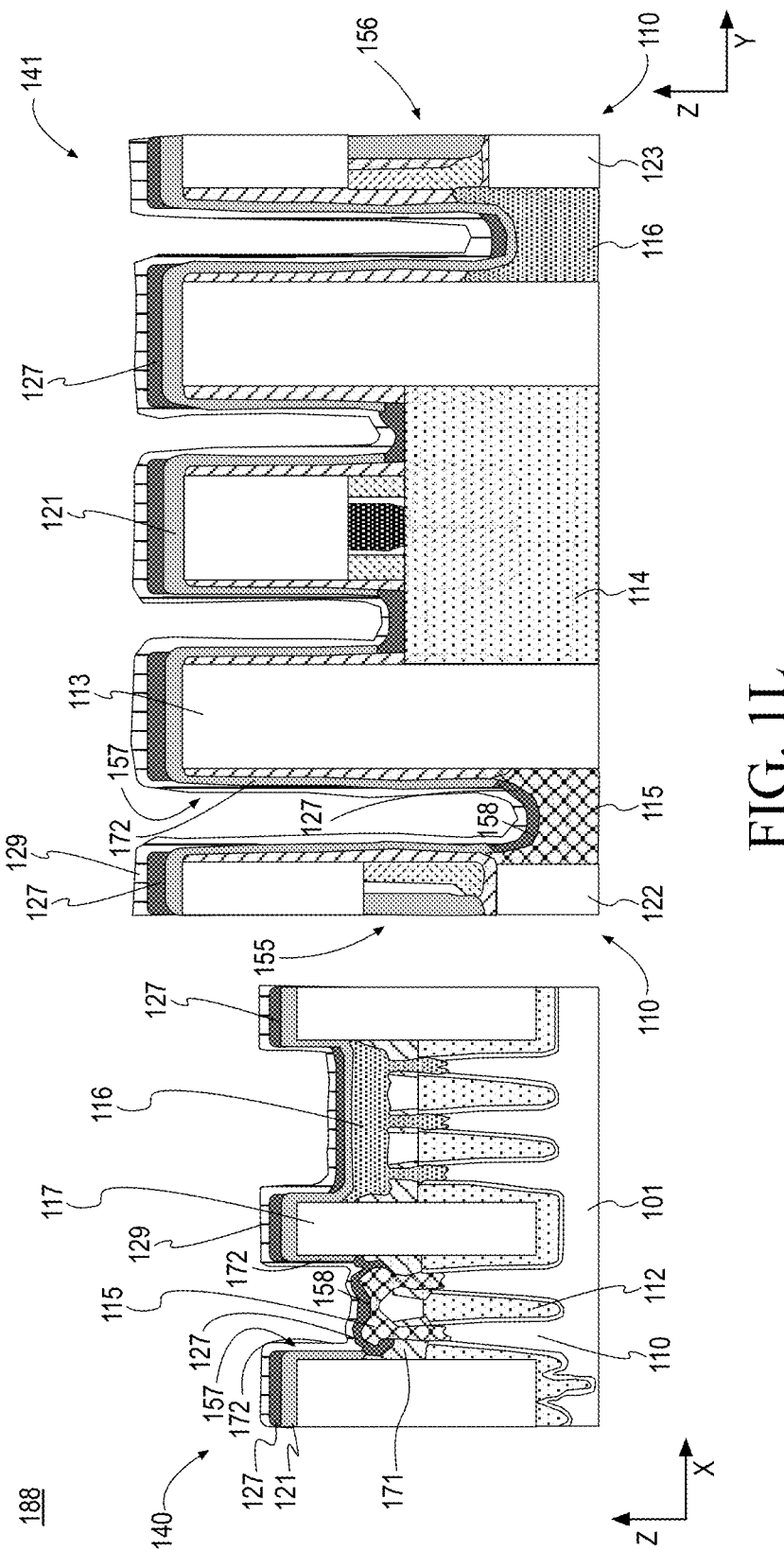
FIG. 1L illustrates cross-sectional views of a device structure similar to the device structure of FIG. 1K after a p-type metal layer is disposed on the n-type metal layer.

FIG. 1L illustrates cross-sectional views of a device structure 188 similar to device structure 187 after p-type metal layer 129 is disposed on n-type metal layer 127, arranged in accordance with at least some implementations of the present disclosure. In some embodiments, the material of p-type metal layer 129 is selected such that encapsulates n-type metal layer 127 to provide a diffusion barrier (or block off material or cap) for n-type metal layer 127, and p-type metal layer 129 may be any p-type metal discussed herein. P-type metal layer 129 may be deposited using any suitable technique or techniques such as PVD, ALD, or CVD. P-type metal layer 129 may be deployed at any suitable thickness such as a thickness in the range of 0.5 nm to 15 nm, a thickness in the range of 2 nm to 10 nm, or a thickness in the range of 1 nm to 6 nm.

Figure 1M:
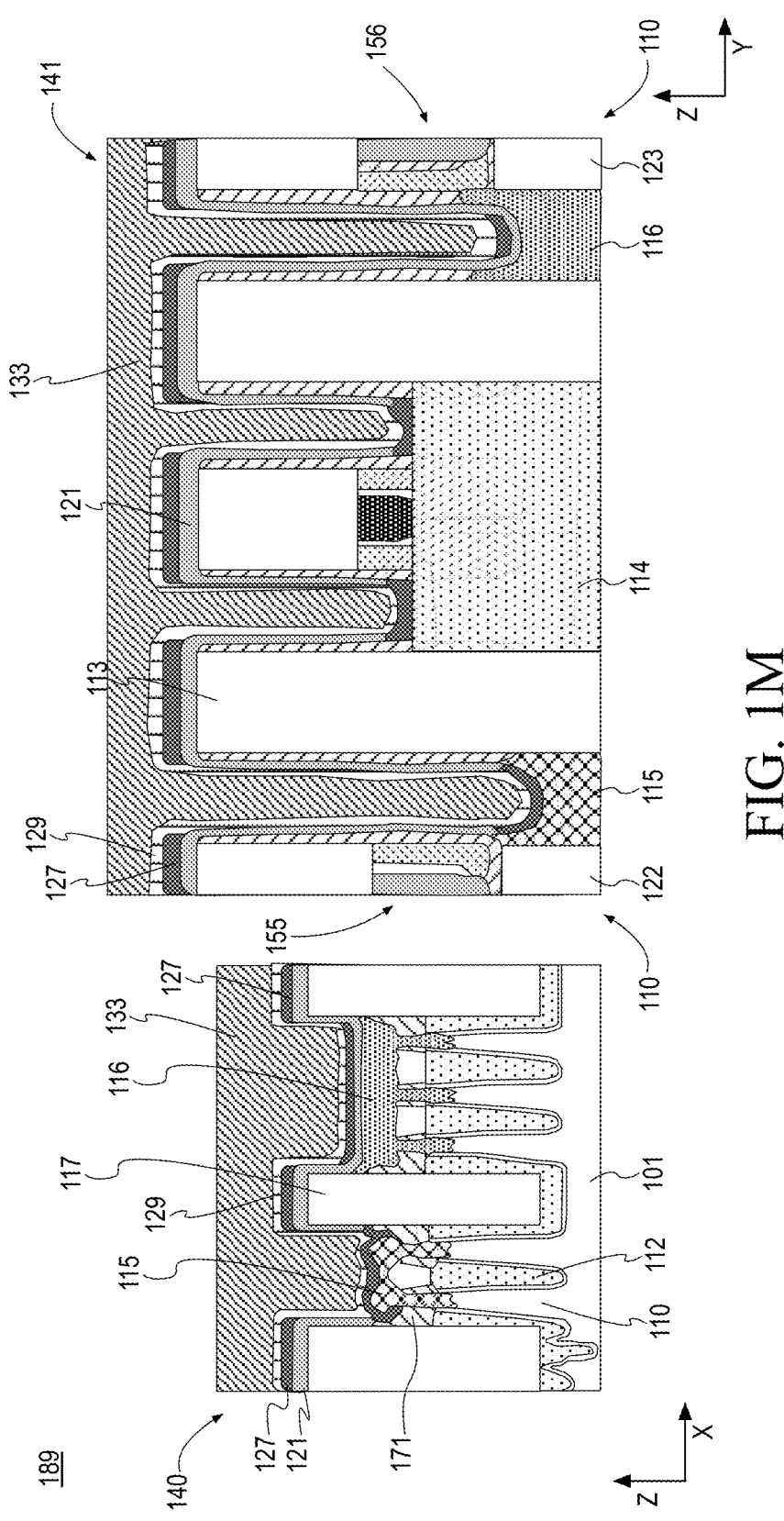
FIG. 1M illustrates cross-sectional views of a device structure similar to the device structure of FIG. 1L after formation of a contact fill metal.

FIG. 1M illustrates cross-sectional views of a device structure 189 similar to device structure 188 after formation of contact fill metal 133, arranged in accordance with at least some implementations of the present disclosure. Contact fill metal 133 may be formed using any suitable technique or techniques such as CVD or ALD. Contact fill metal 133 may be selected to provide relatively low contact resistance. In some embodiments, contact fill metal 133 is a p-type metal such as tungsten, molybdenum, manganese, cobalt, nickel, ruthenium, rhenium, osmium, iridium, platinum, rhodium, or palladium. Notably, in the context of FIG. 1M, n-type source/drain region 115 has a bi-layer of n-type metal layer 127 and p-type metal layer 129 (e.g., a bi-layer of N then P), and p-type source/drain regions 116 have a tri-layer of p-type metal layer 121, n-type metal layer 127, and p-type metal layer 129 (e.g., a P,N,P tri-layer).

Processing of device structure 189 may continue as discussed with respect to FIG. 1I with recess processing for a self aligned gate electrode (SAGE) type structure. Such recessing may recess contact fill metal 133 below a SAGE wall and remove residual metals.

As shown in FIG. 1I, for example, device structure 199 (and other device structures discussed herein) includes n-type source/drain regions 115 with a gate structure therebetween, the gate structure including a gate dielectric and gate electrode or metal therebetween. For example, a gate structure may replace gate structure 155 and the other of n-type source/drain regions 115 may be opposite the gate structure from the illustrated one of n-type source/drain regions 115. Device structure 199 further includes dielectric or isolation materials 113, 117 having sidewalls 157 adjacent n-type source/drain regions 115 (e.g., adjacent the source and/or drain region) such that a portion of sidewalls 157 is laterally adjacent a region 175 above top surface 158 of n-type source/drain regions 115. P-type metal layer 121 is on and covering the portion of sidewalls 157 that is laterally adjacent region 175 above top surface 158 of n-type source/drain regions 115. N-type metal layer 127 is on top surface 158 of n-type source/drain regions 115 and p-type metal layer 129 is on n-type metal layer 127. Contact fill metal 133 is on p-type metal layer 129 and in (i.e., fills) region 175.

FIGS. 1A-1M illustrate exemplary processing operations implemented on tri-gate transistor structures or architectures. However, the operations discussed herein may be applied to any transistor structures or architectures such as gate-all-around (GAA) structures as illustrated in FIGS. 2A-2L or planar transistor structures.

Figure 2A:
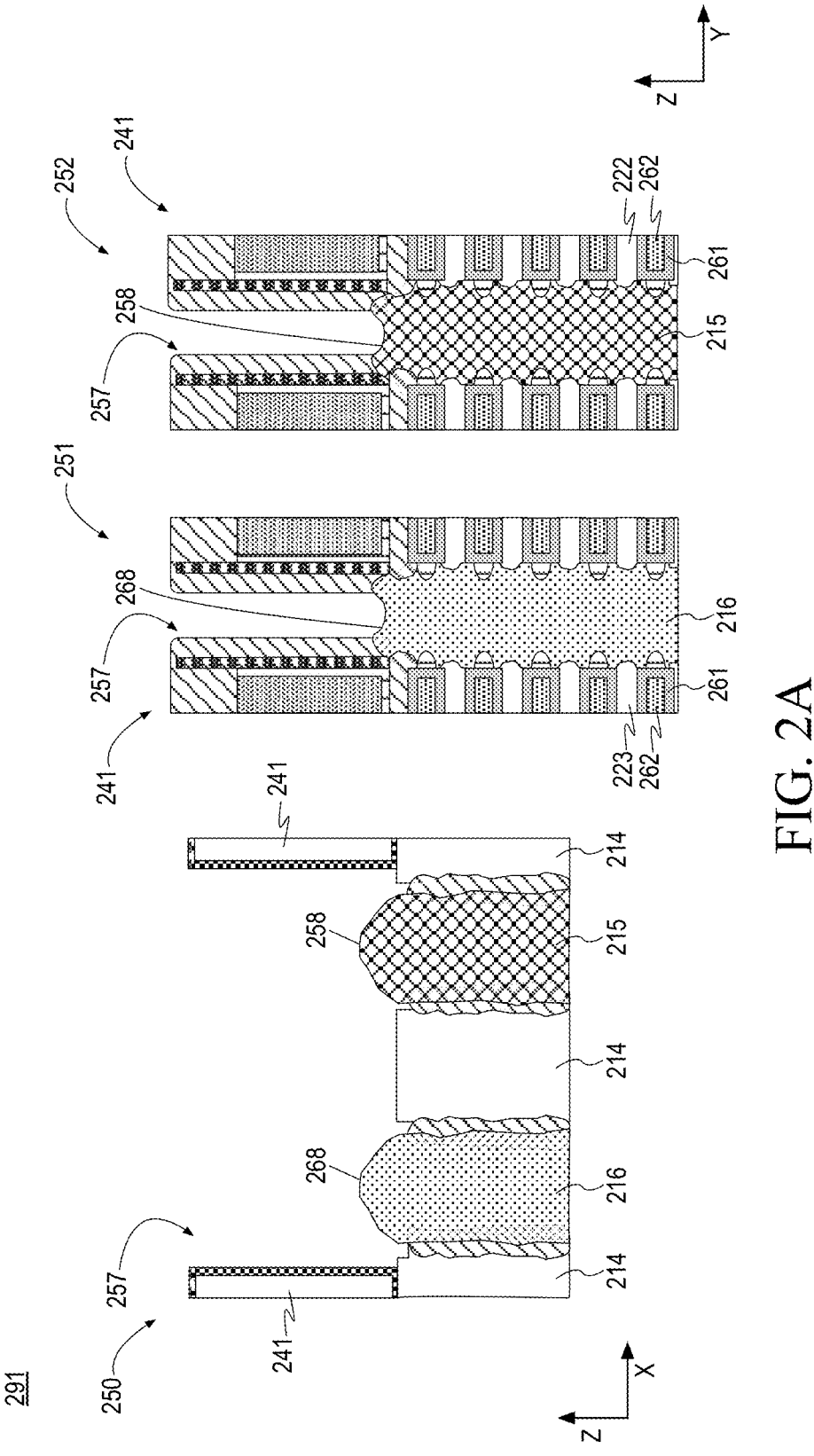
FIG. 2A illustrates cross-sectional views of a gate all around device structure having exposed n-type source and drain regions and p-type source and drain regions.

FIG. 2A illustrates cross-sectional views of a gate all around device structure 291 having exposed n-type source and drain regions and p-type source and drain regions, arranged in accordance with at least some implementations of the present disclosure. Cross-sectional view 250 provides a view taken at a fin cut centered on n-type source/drain region 215 and p-type source/drain region 216. Cross-sectional view 251 provides a view taken at a gate cut centered on p-type source/drain region 216 of a PMOS transistor and cross-sectional view 252 provides a view taken at a gate cut centered on n-type source/drain region 215 of an NMOS transistor.

Such cross-sectional views 250, 251, 252 are also provided in FIGS. 2B-2H. Notably, n-type source/drain region 215 and p-type source/drain region 216 may be sources or drains with the other of such source or drain regions provided into or out of the page in cross-sectional view 250 or to the left or right of the view provided by cross-sectional views 251, 252, as is known in the art. For example, device structure 291 may be provided subsequent to a trench etch to expose n-type source/drain region 215 and p-type source/drain region 216 (e.g., semiconductor contact regions).

As shown in cross-section 250, n-type source/drain regions 215 and p-type source/drain regions 216 are separated by isolation material 214. As shown in cross-section 251, p-type source/drain regions 216 are coupled to nanowires or nanoribbons 223. Notably, another of p-type source/drain regions 216 may be to the left and/or right of the illustrated one of p-type source/drain regions 216. For example, nanoribbons 223 may extend between p-type source/drain regions 216 and another of p-type source/drain regions 216, which is in the negative y-direction or the positive y-direction from the depicted one of p-type source/drain regions 216. Similarly, as shown in cross-section 252, n-type source/drain regions 215 are coupled to nanowires or nanoribbons 222 with nanoribbons 222 extending the illustrated one of n-type source/drain regions 215 and another of n-type source/drain regions 215, which is in the negative y-direction or the positive y-direction from the depicted one of n-type source/drain regions 215.

Furthermore, the NMOS and PMOS transistor structures include a gate dielectric 261 surrounding nanoribbons 222, 223 and a gate metal or electrode 262 to gate nanoribbons 222, 223. Nanoribbons 222, 223 may also be characterized as channels, channel regions, or channel structures. Gate metal or electrode 262 may comprise a work function metal and a gate fill metal in some embodiments.

N-type source/drain region 215 may include any suitable n-type semiconductor material such as silicon, germanium, or silicon and germanium doped with donor dopants such as one or more of phosphorous, arsenic, antimony, and bismuth. In some embodiments, n-type source/drain region 215 includes one of silicon, germanium, or silicon and germanium doped with phosphorous. In some embodiments, n-type source/drain region 215 includes one of silicon, germanium, or silicon and germanium doped with arsenic. In some embodiments, n-type source/drain region 215 includes one of silicon, germanium, or silicon and germanium doped with antimony. In some embodiments, n-type source/drain region 215 includes one of silicon, germanium, or silicon and germanium doped with bismuth. As discussed, multiple dopants may be used. Similarly, p-type source/drain region 216 and may include any suitable p-type semiconductor material such as silicon, germanium, or silicon and germanium doped with acceptor dopants such as one or more of boron, gallium, or indium. In some embodiments, p-type source/drain region 216 includes one of silicon, germanium, or silicon and germanium doped with boron. In some embodiments, p-type source/drain region 216 includes one of silicon, germanium, or silicon and germanium doped with gallium. In some embodiments, p-type source/drain region 216 includes one of silicon, germanium, or silicon and germanium doped with indium. Multiple dopants may be deployed.

In some embodiments, n-type source/drain regions 215 and p-type source/drain region 216 are epitaxially grown from nanoribbons 222, 223. N-type source/drain regions 215 and p-type source/drain region 216 may be separated by isolation material 214. Isolation material 214 may be any suitable insulator. Furthermore, isolation structures or materials 241 (which may also be characterized as dielectric structures or materials) provide isolation between components of device structure 291. Isolation structures or materials 241 may include multiple components, as shown, or an individual material. Such isolation structures or materials 241 (which may also be characterized as dielectric structures or materials) provide isolation between may be any suitable insulative materials such as carbon-doped oxide, silicon nitride, silicon oxide, or other carbides or nitrides (e.g., silicon carbide, silicon nitride doped with carbon, or silicon oxynitride). As discussed, during metal deposition of sensitive n-type metals, providing a barrier on such materials provides for the ability to form n-type metal layers on n-type source/drain region 215.

For example, during metal deposition processing, exposed isolation materials may disadvantageously emit contaminates that causes difficulties during metal deposition, particularly with respect to deposition of sensitive n-type metals. Isolation structures or materials 241 include surfaces inclusive of lateral or horizontal surfaces and sidewall surfaces such as sidewalls 257 that extend to a higher vertical position than that of top surface 258 of n-type source/drain region 215 and top surface 268 of p-type source/drain region 216. Using the techniques discussed herein, during n-type metal deposition, such surfaces are entirely or substantially covered.

Figure 2B:
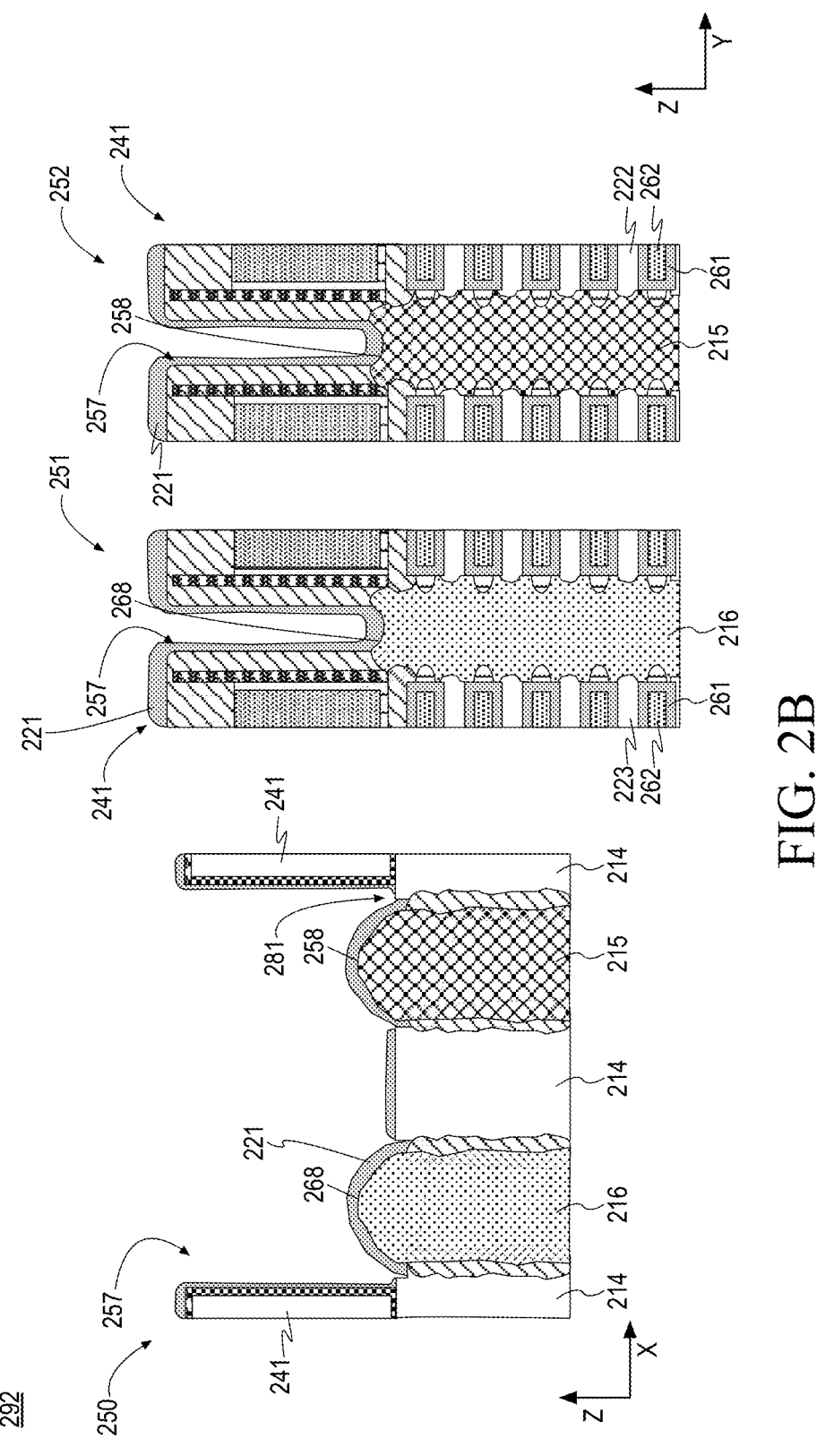
FIG. 2B illustrates cross-sectional views of a device structure similar to the device structure of FIG. 2A after a p-type metal layer is disposed over the n-type source/drain regions and the p-type source/drain regions.

FIG. 2B illustrates cross-sectional views of a device structure 292 similar to device structure 291 after a p-type metal layer 221 is disposed over n-type source/drain regions 215 and p-type source/drain regions 216, arranged in accordance with at least some implementations of the present disclosure. In some embodiments, the material of p-type metal layer 221 is selected such that it provides relatively low contact resistance to p-type source/drain regions 216 such that it provides a diffusion barrier for dielectric materials adjacent n-type source/drain regions 215. For example, during deposition of n-type metal to n-type source/drain regions 215, p-type metal layer 221 remain on entireties or portions of isolation material 214 and/or isolation structures or materials 241 to seal contaminates during such n-type metal deposition processing.

In some embodiments, p-type metal layer 221 is or includes one or more of tungsten, molybdenum, manganese, cobalt, nickel, ruthenium, rhenium, osmium, iridium, platinum, rhodium, or palladium. In some embodiments, p-type metal layer 221 is advantageously a liner material including one of molybdenum, manganese, cobalt, nickel, ruthenium, rhenium, osmium, iridium, platinum, rhodium, or palladium such that a later tungsten material fill may be deployed. P-type metal layer 221 may be deposited using any suitable technique or techniques. In various embodiments, p-type metal layer 221 is deposited using PVD, sputter techniques, ALD, or CVD. P-type metal layer 221 may be deposited to any suitable thickness such as a thickness in the range of 0.5 nm to 10 nm. In some embodiments, p-type metal layer 221 has a thickness in the range of 2 nm to 6 nm. In some embodiments, p-type metal layer 221 has a thickness in the range of 1 nm to 4 nm.

As shown in FIG. 2B, p-type metal layer 221 is formed on n-type source/drain regions 215 (e.g., including an n-type semiconductor material), p-type source/drain region 216 (e.g., including a p-type semiconductor material), and isolation structures or materials 214, 241 (e.g., dielectric materials such as oxide dielectric materials). In some embodiments, discontinuities 281 are provided during deposition of p-type metal layer 221.

Figure 2C:
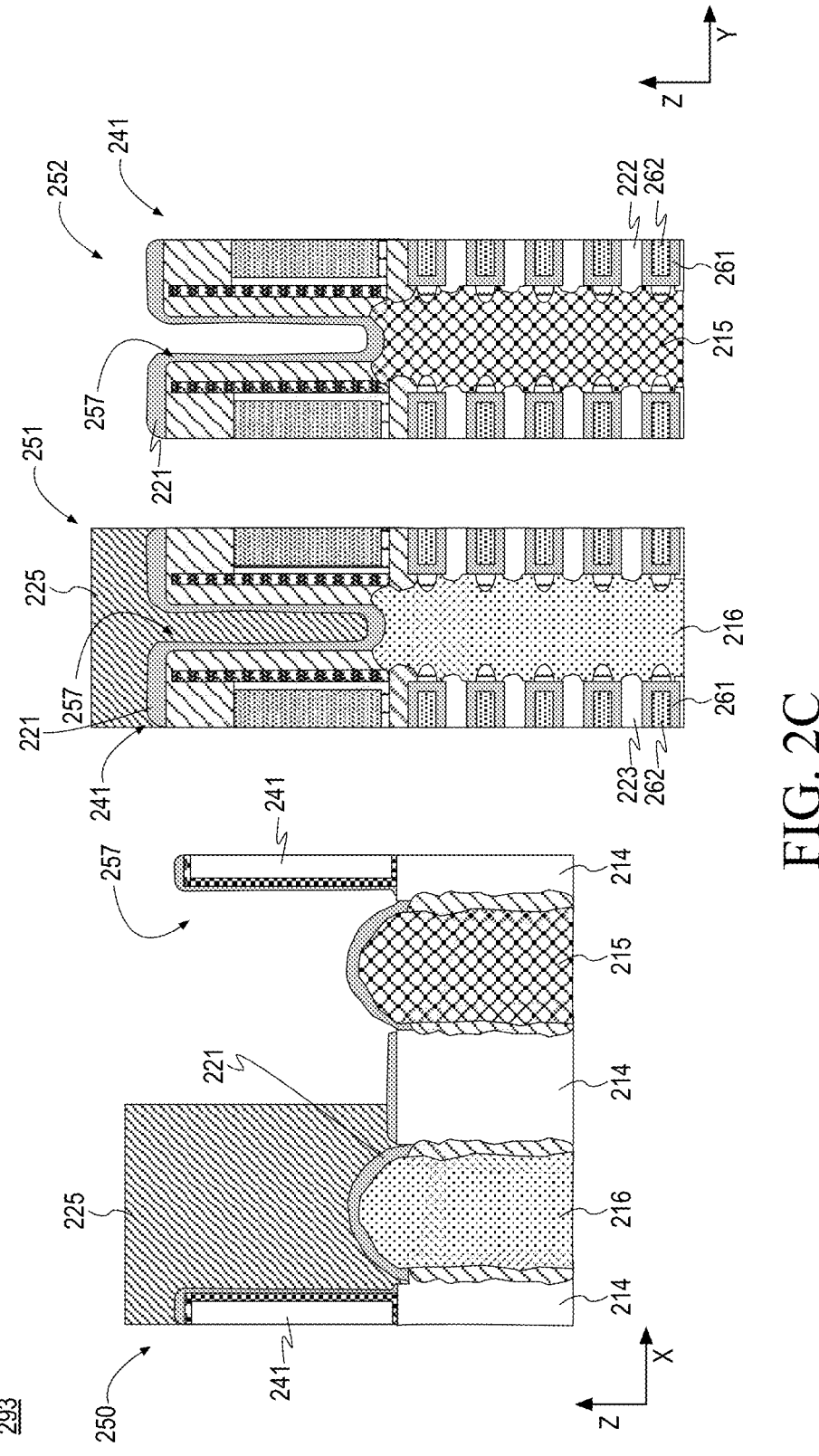
FIG. 2C illustrates cross-sectional views of a device structure similar to the device structure of FIG. 2B after formation of a mask layer that covers the p-type metal layer over the p-type source/drain regions and exposes the p-type metal layer over the n-type source/drain regions.

FIG. 2C illustrates cross-sectional views of a device structure 293 similar to device structure 292 after formation of a mask layer 225 that covers p-type metal layer 221 over p-type source/drain regions 216 and exposes p-type metal layer 221 over n-type source/drain regions 215, arranged in accordance with at least some implementations of the present disclosure. Mask layer 225 may be any suitable material such as a carbon hardmask or the like and mask layer 225 may be formed using any suitable technique or techniques such as lithography processing. Such processing is used to expose p-type metal layer 221 over n-type source/drain regions 215 and adjacent regions and to mask p-type metal layer 221 over p-type source/drain regions 216 and adjacent regions.

Figure 2D:
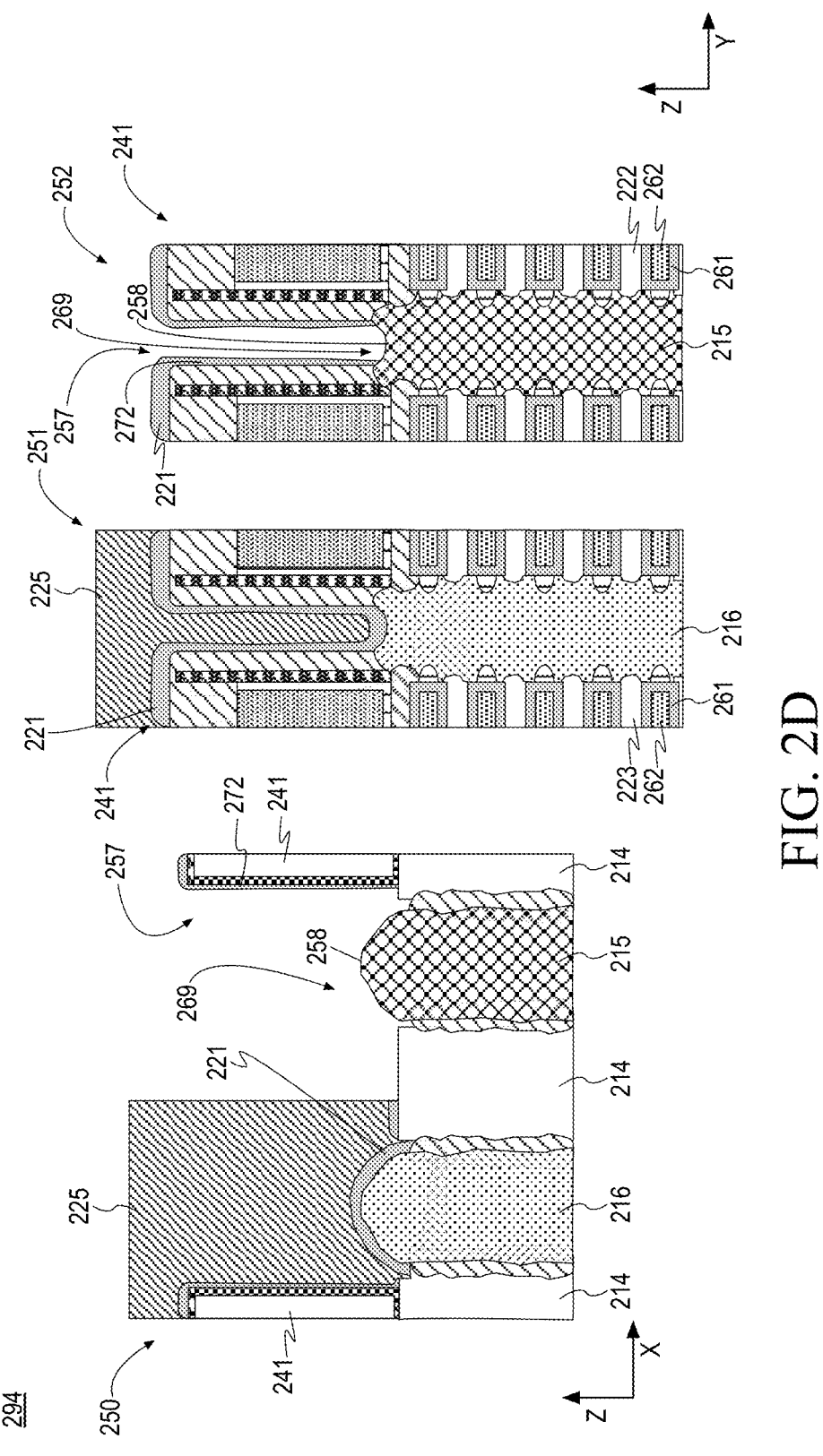
FIG. 2D illustrates cross-sectional views of a device structure similar to the device structure of FIG. 2C after removal of portions of the p-type metal layer.

FIG. 2D illustrates cross-sectional views of a device structure 294 similar to device structure 293 after removal of portions 269 of p-type metal layer 221, arranged in accordance with at least some implementations of the present disclosure. As shown, removal of portions 269 provides for exposure of n-type source/drain regions 215 inclusive of top surfaces 258 of n-type source/drain regions 215. Removal of portions 269 of p-type metal layer 121 may also expose surfaces of isolation material 214. Removal of portions 269 of p-type metal layer 221 leaves isolation structures or materials 241, inclusive of sidewalls 257 of isolation structures or materials 241 covered with portions 272 of p-type metal layer 221. In some embodiments, such dielectric and isolation materials may be fully covered by remaining portions 272 of p-type metal layer 221 (i.e., a barrier layer). However, even in contexts where some portions of such dielectric and isolation materials are exposed, the surface area of such exposure is dramatically reduced by remaining portions 272 of p-type metal layer 221.

Portions 269 of p-type metal layer 221 may be removed using any suitable technique or techniques such as normal incidence etch techniques inclusive of sputter etch techniques. In some embodiments, portions 269 of p-type metal layer 221 are removed using an argon etch where a plasma of argon ions is formed and biased to a normal incidence on the device structure. For example, the sputter etch may be performed using a PVD tool. In some embodiments, normal incidence etch processing removes portions 269 of p-type metal layer 221 more rapidly within the features of n-type source/drain regions 215 and adjacent features. For example, portions of p-type metal layer 221 may remain on the top surfaces of isolation structures or materials 241. In other examples, portions of p-type metal layer 221 may be removed from the top surfaces of isolation structures or materials 241. Such techniques provide selective etch of the p-type metal from the NMOS semiconductor material at the bottom the contacts.

As shown in FIG. 2D, a portion or portions 269 of p-type metal layer 221 are selectively removed from n-type source/ drain regions 215 such that a portion or portions 272 of p-type metal layer 221 remains on an oxide dielectric material sidewall (i.e., sidewalls 257 of isolation structures or materials 241) after the selective removal of portion or portions 269 of p-type metal.

Figure 2E:
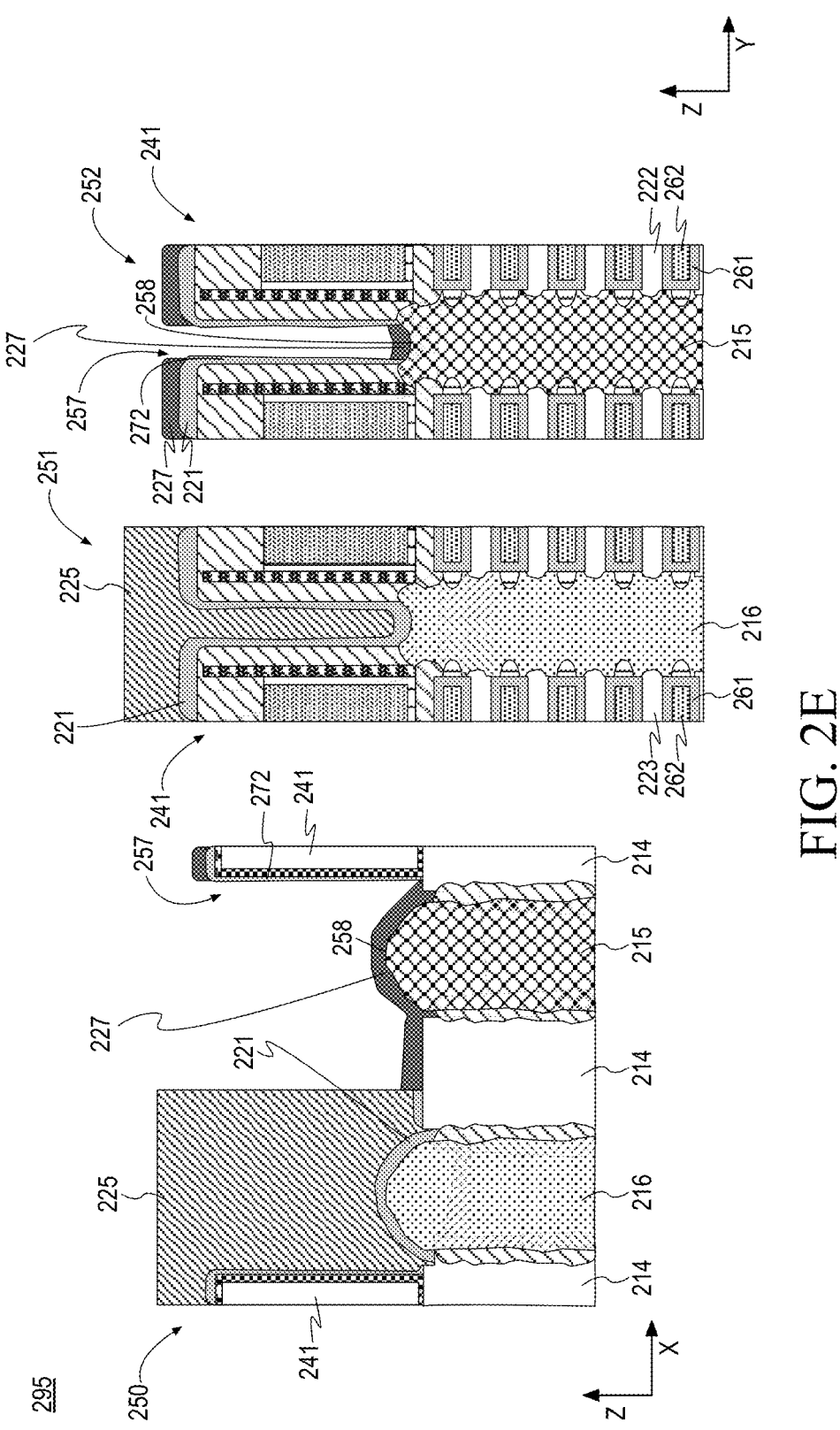
FIG. 2E illustrates cross-sectional views of a device structure similar to the device structure of FIG. 2D after an n-type metal layer is disposed selectively on the n-type source/drain regions.

FIG. 2E illustrates cross-sectional views of a device structure 295 similar to device structure 294 after an n-type metal layer 227 is disposed selectively on n-type source/drain regions 215, arranged in accordance with at least some implementations of the present disclosure. In some embodiments, the material of n-type metal layer 227 is selected such that it provides relatively low contact resistance to n-type source/drain regions 215. For example, the material of n-type metal layer 227 may be selected such that it provides relatively low contact resistance at the interface between n-type source/drain regions 215 and n-type metal layer 227. As shown, in some embodiments, n-type metal layer 227 is not formed on mask layer 225 nor on portions 272 of p-type metal layer 221 that are on sidewalls 257 of isolation structures or materials 241. In some embodiments, n-type metal layer 227 may be formed on one or both of mask layer 225 or portions 272.

As discussed, portions 272 of p-type metal layer 221 provide a contamination barrier during the formation of n-type metal layer 227. As shown, some dielectric materials such as portions of isolation material 214 may be exposed during the deposition, but the reduction in exposure is such that n-type metals that maintain low resistance may be successfully deposited. In some embodiments, during deposition of n-type metal layer 227, a lateral surface of an oxide dielectric material (e.g., isolation material 214 and/or isolation structures or materials 241) may be exposed.

The discussed techniques enable the use of a variety of n-type metal materials that would otherwise be unusable due to contamination such the lanthanides, alkaline earth metals, and early transition metals. In some embodiments, n-type metal layer 227 is or includes one or more of cerium, praseodymium, neodymium, promethium, samarium, europium, gadolinium, terbium, dysprosium, holmium, erbium, thulium, ytterbium, or lutetium. In some embodiments, n-type metal layer 227 is or includes one or more of magnesium, calcium, strontium, or barium. In some embodiments, n-type metal layer 227 is or includes one or more of scandium, yttrium, lanthanum, titanium, zirconium, or hafnium. In some embodiments, n-type metal layer 227 is or includes one or more of cerium, praseodymium, neodymium, promethium, samarium, europium, gadolinium, terbium, dysprosium, holmium, erbium, thulium, ytterbium, lutetium. magnesium, calcium, strontium, barium, scandium, yttrium, lanthanum, titanium, zirconium, or hafnium. Combinations of such metals may be used.

N-type metal layer 227 may be deposited using any suitable technique or techniques such as PVD, ALD, or CVD. N-type metal layer 227 may be deposited to any suitable thickness such as a thickness in the range of 0.5 nm to 10 nm, a thickness in the range of 2 nm to 6 nm, or a thickness in the range of 1 nm to 4 nm.

As shown in FIG. 2E, n-type metal layer 227 is formed on n-type source/drain regions 215 but not on p-type source/drain regions 216 due to mask 225. Furthermore, isolation structures or materials 241 and isolation material 214 (e.g., dielectric materials such as oxide dielectric materials) are largely protected during the deposition of n-type metal layer 227 such that selective deposition of n-type metal layer 227 on n-type source/drain regions 215 is provided with little or no contamination of n-type metal layer 227.

Figure 2F:
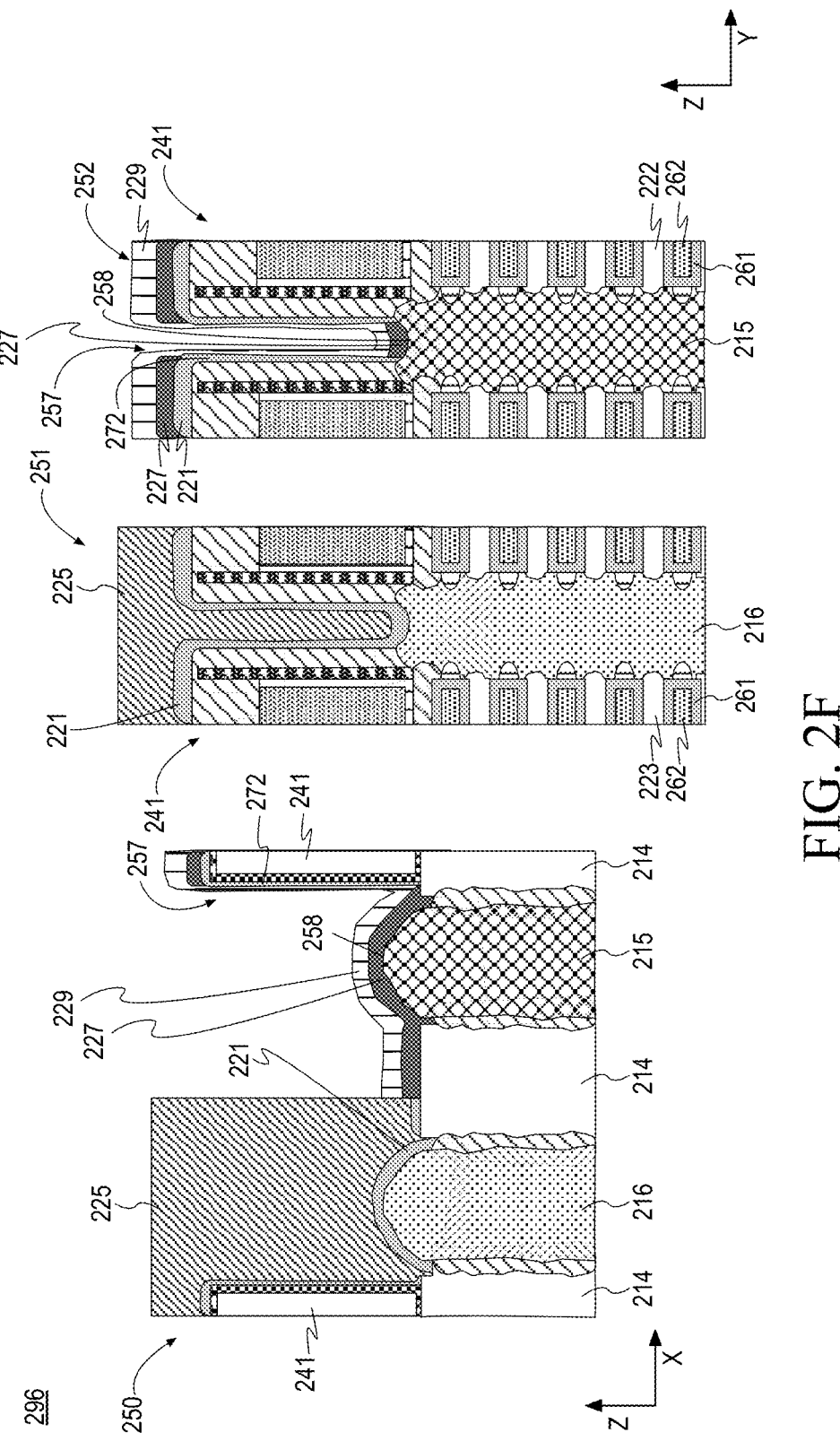
FIG. 2F illustrates cross-sectional views of a device structure similar to the device structure of FIG. 2E after a p-type metal layer is disposed on the n-type metal layer.

FIG. 2F illustrates cross-sectional views of a device structure 296 similar to device structure 295 after a p-type metal layer 229 is disposed on n-type metal layer 227, arranged in accordance with at least some implementations of the present disclosure. In some embodiments, the material of p-type metal layer 229 is selected such that encapsulates n-type metal layer 227 to provide a diffusion barrier or cap for n-type metal layer 227. In some embodiments, n-type metal layer 227 and p-type metal layer 229 are deposited using operations performed in the same vacuum chamber without vacuum release therebetween. As discussed, using such techniques, n-type metal layer 227 is advantageously not exposed to an environment including contaminants. In other embodiments, n-type metal layer 227 may be exposed only to an inert environment prior to application of p-type metal layer 229.

P-type metal layer 229 may include any material discussed with respect to p-type metal layer 221. In some embodiments, p-type metal layer 229 is or includes one or more of tungsten, molybdenum, manganese, cobalt, nickel, ruthenium, rhenium, osmium, iridium, platinum, rhodium, or palladium. In some embodiments, p-type metal layer 229 is advantageously a liner material including one of molybdenum, manganese, cobalt, nickel, ruthenium, rhenium, osmium, iridium, platinum, rhodium, or palladium such that a later tungsten material fill may be deployed. In some embodiments, p-type metal layer 229 is advantageously a material other than that of p-type metal layer 221. For example, p-type metal layer 229 may be one of molybdenum, manganese, cobalt, nickel, ruthenium, rhenium, osmium, iridium, platinum, rhodium, or palladium while p-type metal layer 221 may be another of molybdenum, manganese, cobalt, nickel, ruthenium, rhenium, osmium, iridium, platinum, rhodium, or palladium. In some embodiments, p-type metal layer 229 and p-type metal layer 221 are different p-type metal materials. P-type metal layer 229 may be deposited using any suitable technique or techniques such as PVD, sputter, ALD, or CVD. P-type metal layer 229 may be applied at any suitable thickness such as a thickness in the range of 0.5 nm to 15 nm, a thickness in the range of 2 nm to 10 nm, or a thickness in the range of 1 nm to 6 nm.

As shown in FIG. 2F, p-type metal layer 229 is selective deposited on n-type metal layer 227 to provide a contaminant barrier. In some embodiments, as shown, p-type metal layer 229 is deposited over sidewalls 257 (i.e., on p-type metal layer 221). In other embodiments, p-type metal layer 229 is not formed over such sidewalls 257 but is instead selectively formed over the portion of n-type metal layer 227 that is on n-type source/drain regions 215.

Figure 2G:
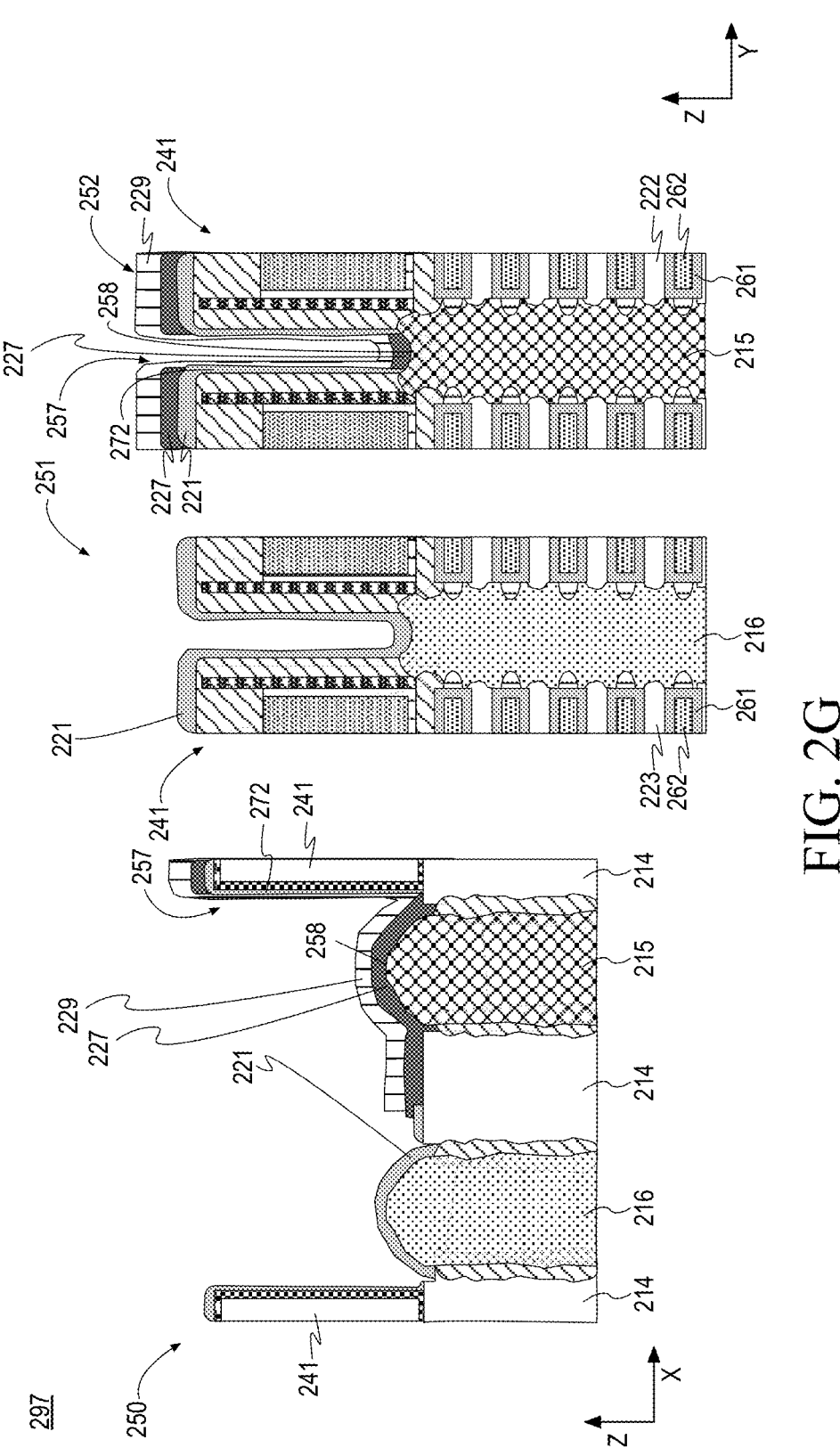
FIG. 2G illustrates cross-sectional views of a device structure similar to the device structure of FIG. 2F after removal of the mask layer.

FIG. 2G illustrates cross-sectional views of a device structure 297 similar to device structure 296 after removal of mask layer 225, arranged in accordance with at least some implementations of the present disclosure. Mask layer 225 may be removed using any suitable technique or techniques such as an ashing process to ash a carbon hardmask or similar material. As shown, removal of mask layer 225 exposes the portion of p-type metal layer 221 over p-type source/drain regions 216. As discussed herein, p-type metal layer 221 (e.g., tungsten, molybdenum, manganese, cobalt, nickel, ruthenium, rhenium, osmium, iridium, platinum, rhodium, or palladium) provides a low resistance contact for p-type source/drain regions 216.

Figure 2H:
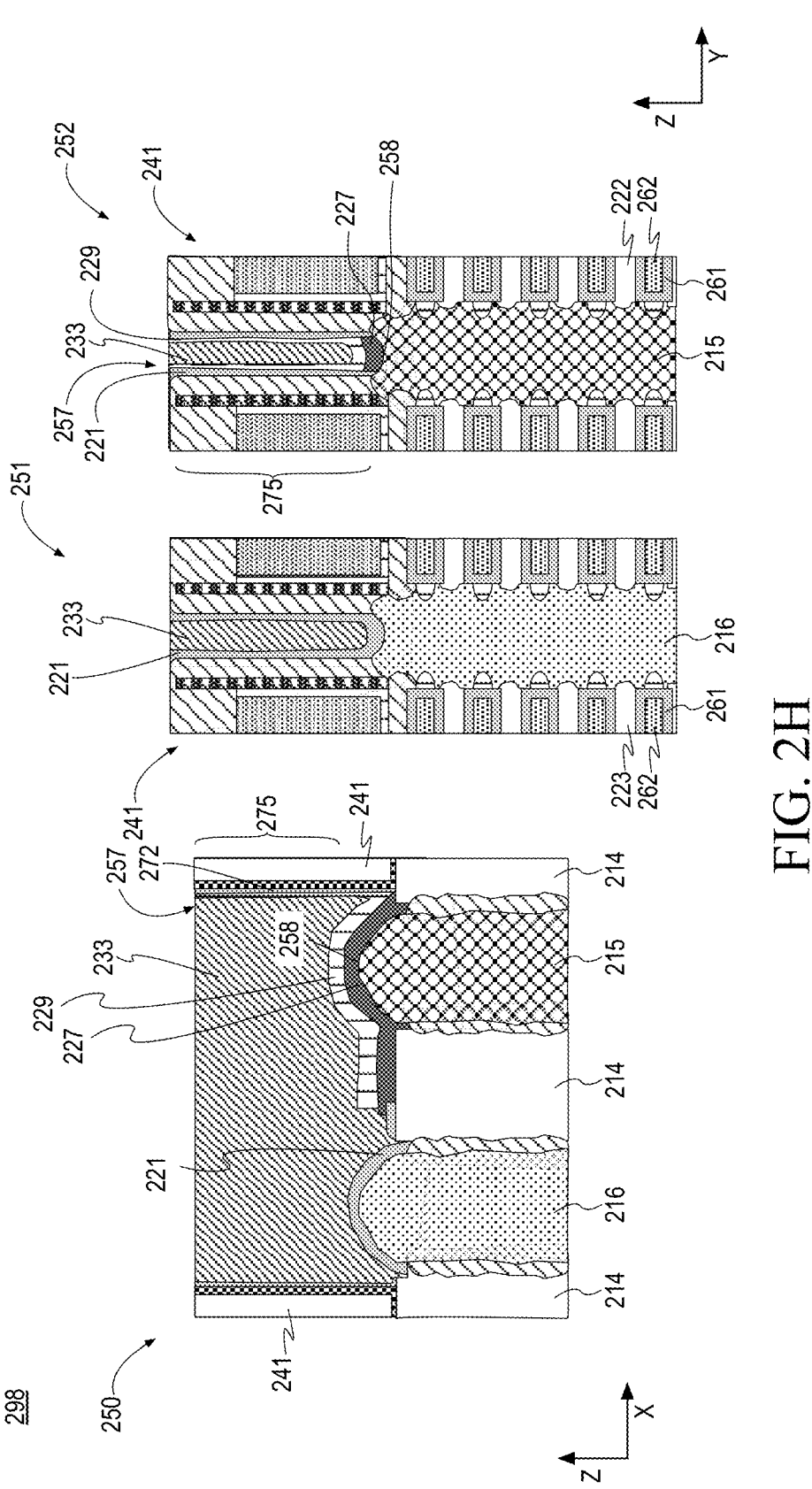
FIG. 2H illustrates cross-sectional views of a device structure similar to the device structure of FIG. 2G after formation of a contact fill metal and a polish operation.

FIG. 2H illustrates cross-sectional views of a device structure 298 similar to device structure 297 after formation of a contact fill metal 233 and a polish operation, arranged in accordance with at least some implementations of the present disclosure. Contact fill metal 233 may be formed using any suitable technique or techniques such as deposition via CVD or ALD. The material of contact fill metal 233 may be selected to provide relatively low contact resistance to both p-type metal layer 221 and p-type source/drain regions 216 as well as to the metal stack of n-type metal layer 227 and p-type metal layer 229 and n-type source/drain regions 215. In some embodiments, contact fill metal 233 is a p-type metal such as tungsten, molybdenum, manganese, cobalt, nickel, ruthenium, rhenium, osmium, iridium, platinum, rhodium, or palladium. In some embodiments, contact fill metal 233 is tungsten and p-type metal layers 221, 229 are a p-type metal material or materials other than tungsten.

FIGS. 2A-2H illustrate exemplary processing operations inclusive of applying n-type metal 227 and p-type metal 229 with mask 225 in place, removing mask 225 and then providing fill metal 233. FIGS. 2I-2L illustrate exemplary processing operations inclusive of first removing mask 225, then applying n-type metal 227 and p-type metal 229, and subsequent providing fill metal 233. After the processing illustrated by FIG. 2L, planarization processing as discussed herein may then be performed.

Figure 2I:
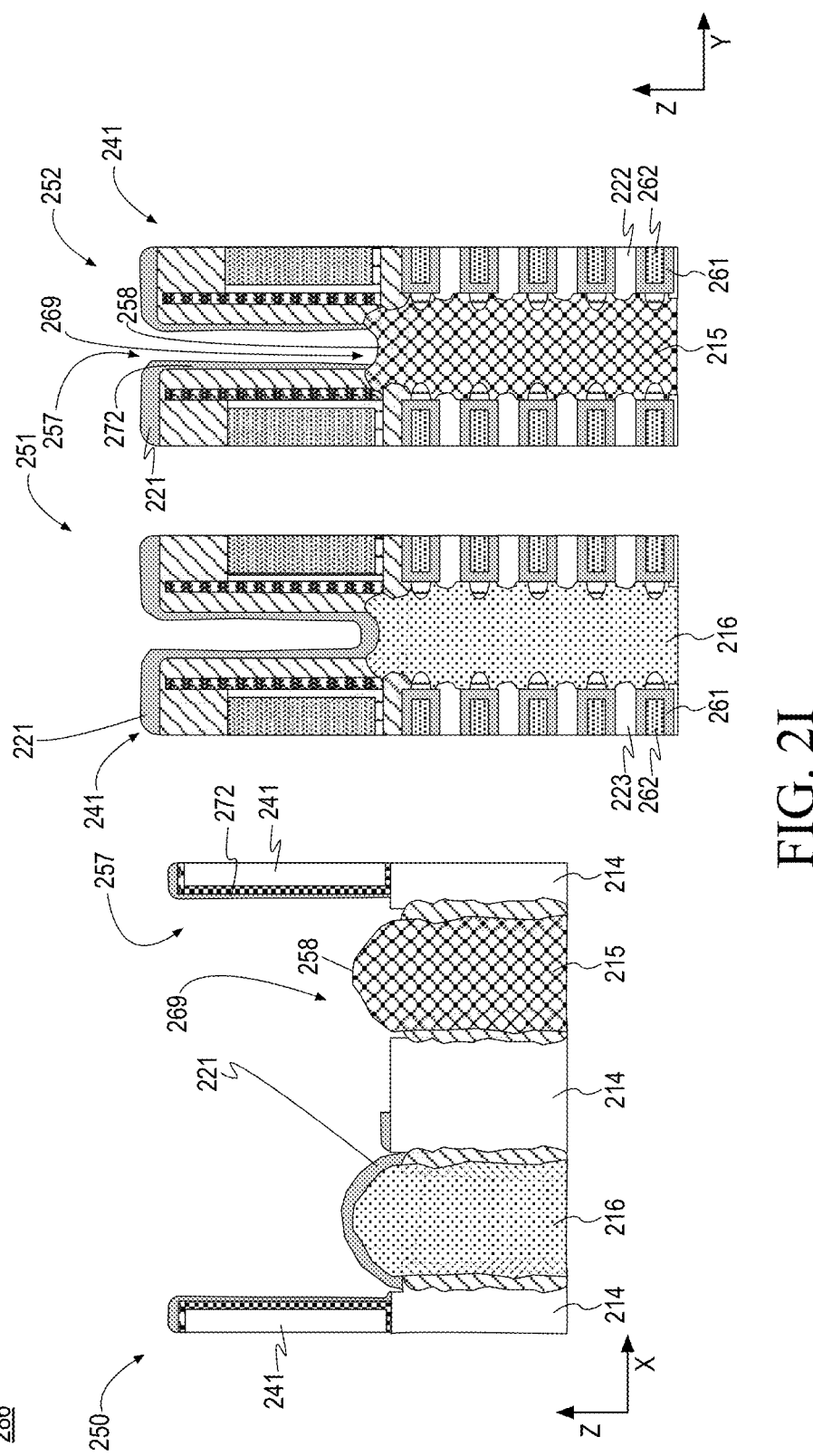
FIG. 2I illustrates cross-sectional views of a device structure similar to the device structure of FIG. 2D after removal of the mask layer.

FIG. 2I illustrates cross-sectional views of a device structure 286 similar to device structure 294 (refer to FIG. 2D) after removal of mask layer 225, arranged in accordance with at least some implementations of the present disclosure. Mask layer 225 may be removed using any suitable technique or techniques such as an ashing process to ash a carbon hardmask or similar material. As shown, removal of mask layer 225 exposes the portion of p-type metal layer 221 over p-type source/drain regions 216.

Figure 2J:
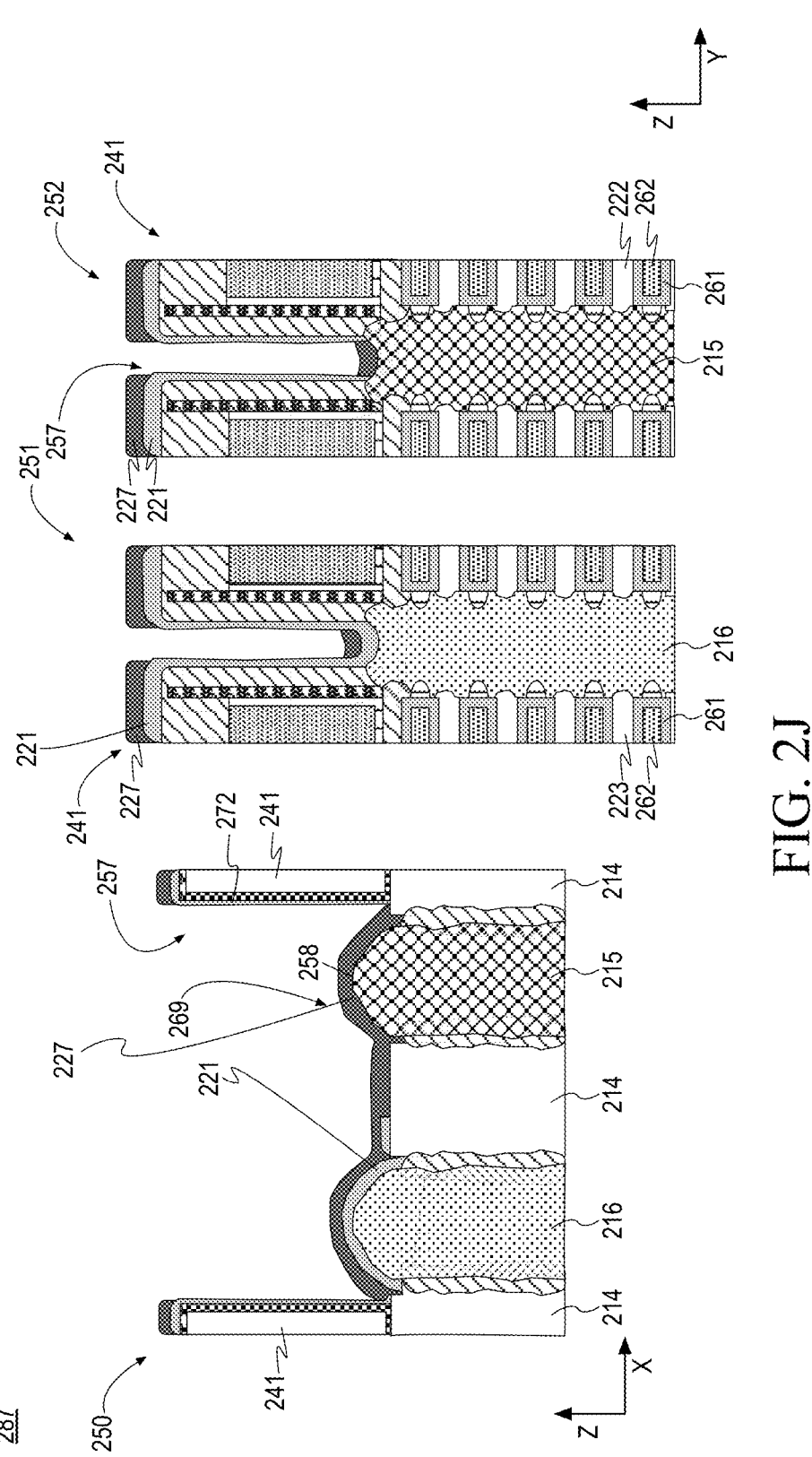
FIG. 2J illustrates cross-sectional views of a device structure similar to the device structure of FIG. 2I after an n-type metal layer is bulk disposed on n-type source/drain regions and the p-type metal layer.

FIG. 2J illustrates cross-sectional views of a device structure 287 similar to device structure 286 after n-type metal layer 227 is bulk disposed on n-type source/drain regions 215 and p-type metal layer 221, arranged in accordance with at least some implementations of the present disclosure. In some embodiments, the material of n-type metal layer 227 is selected such that it provides relatively low contact resistance to n-type source/drain regions 215, and n-type metal layer 227 may be any material discussed herein. Furthermore, portions 272 of p-type metal layer 221 provide a contamination barrier during the formation of n-type metal layer 227. N-type metal layer 227 may be deposited using any suitable technique or techniques such as PVD, ALD, CVD to any suitable thickness such as a thickness in the range of 0.5 nm to 10 nm, a thickness in the range of 2 nm to 6 nm, or a thickness in the range of 1 nm to 4 nm.

Figure 2K:
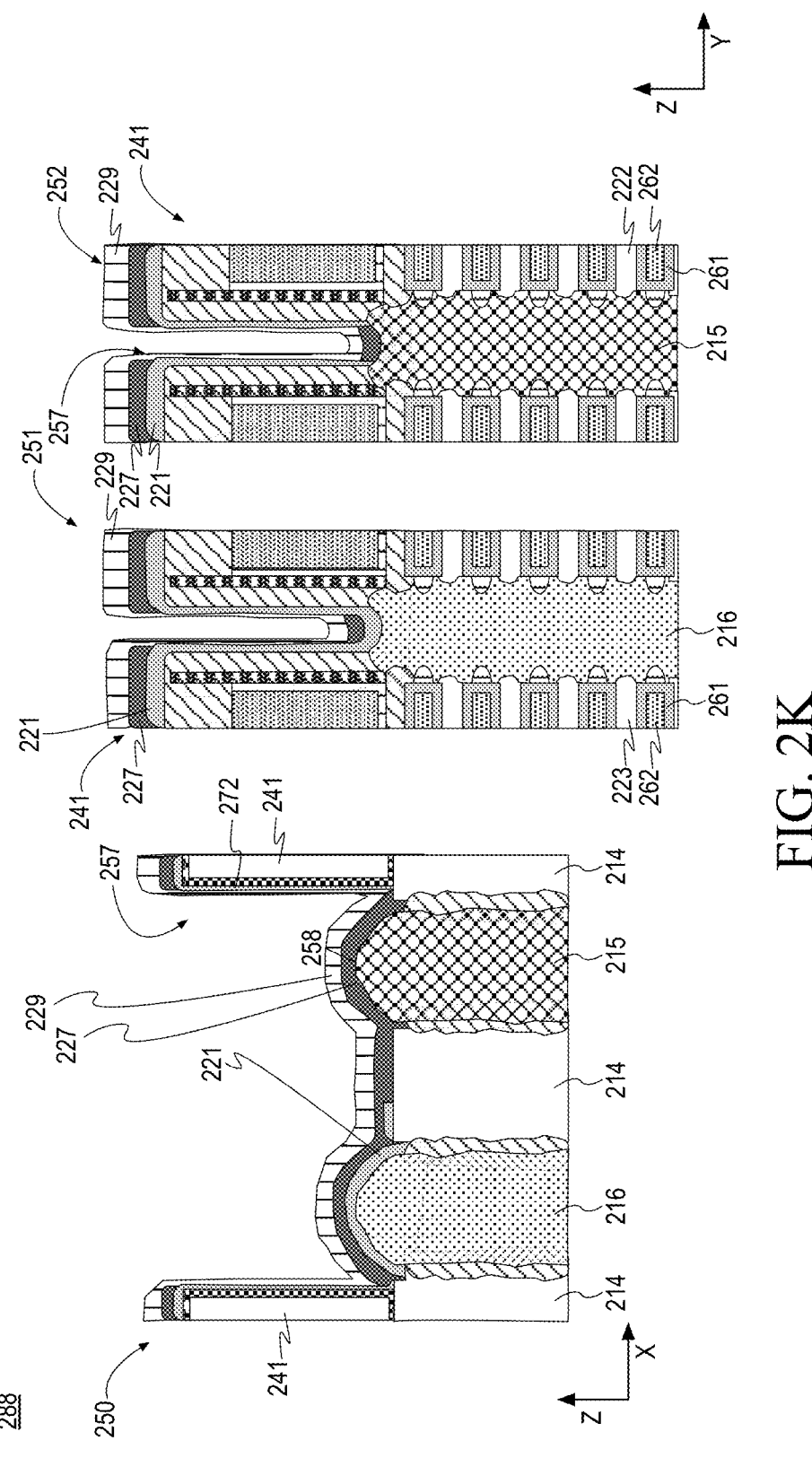
FIG. 2K illustrates cross-sectional views of a device structure similar to the device structure of FIG. 2J after a p-type metal layer is disposed on the n-type metal layer.

FIG. 2K illustrates cross-sectional views of a device structure 288 similar to device structure 287 after p-type metal layer 229 is disposed on n-type metal layer 227, arranged in accordance with at least some implementations of the present disclosure. In some embodiments, the material of p-type metal layer 229 is selected such that encapsulates n-type metal layer 227 to provide a diffusion barrier (or block off material or cap) for n-type metal layer 227, and p-type metal layer 229 may be any p-type metal discussed herein. P-type metal layer 129 may be deposited using any suitable technique or techniques such as PVD, ALD, or CVD. P-type metal layer 129 may be deployed at any suitable thickness such as a thickness in the range of 0.5 nm to 15 nm, a thickness in the range of 2 nm to 10 nm, or a thickness in the range of 1 nm to 6 nm.

Figure 2L:
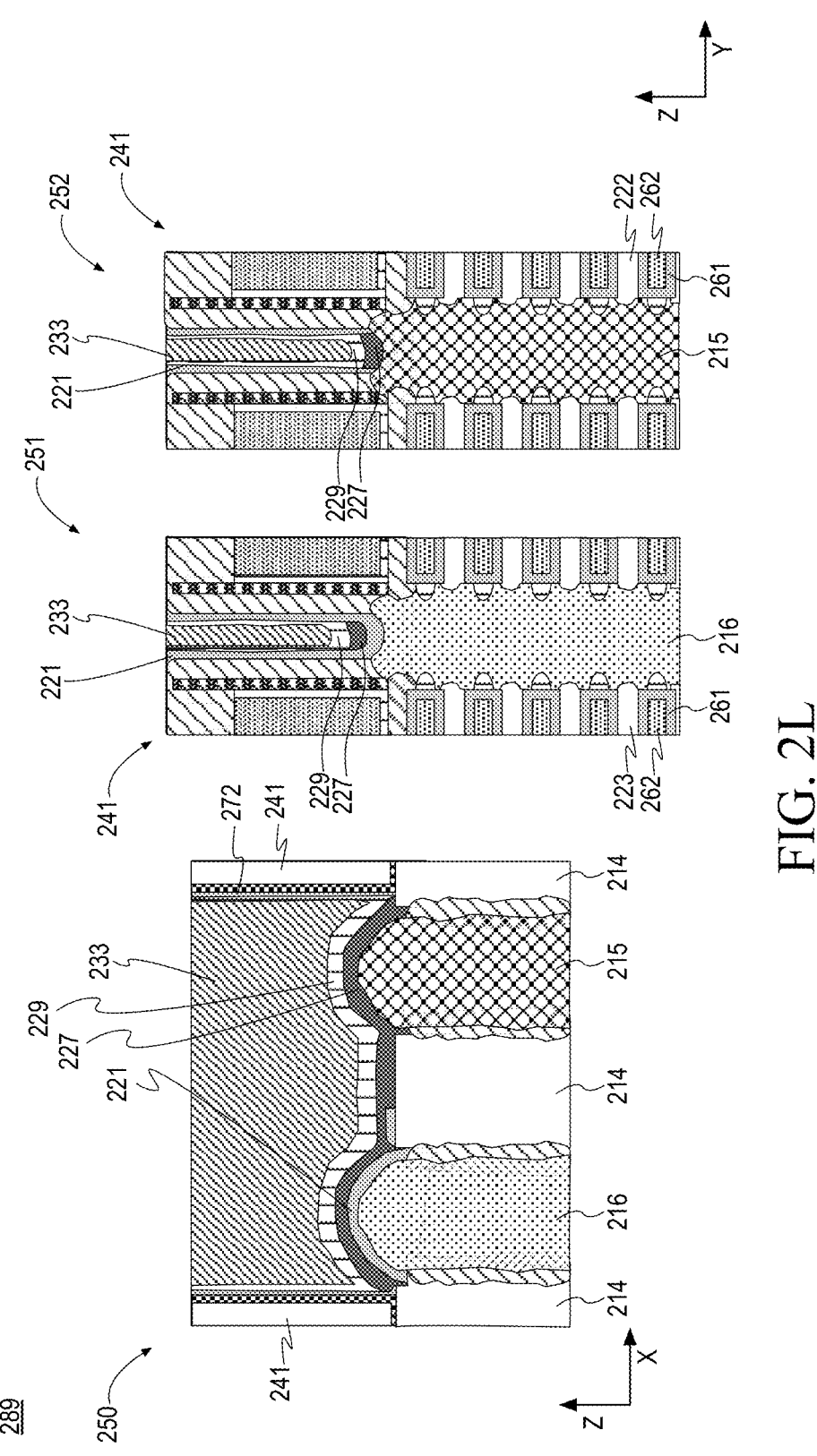
FIG. 2L illustrates cross-sectional views of a device structure similar to the device structure of FIG. 2K after formation of a contact fill metal and a polish operation.

FIG. 2L illustrates cross-sectional views of a device structure 289 similar to device structure 288 after formation of contact fill metal 233 and a polish operation, arranged in accordance with at least some implementations of the present disclosure. Contact fill metal 233 may be formed using any suitable technique or techniques such as CVD or ALD.

Contact fill metal 233 may be selected to provide relatively low contact resistance. In some embodiments, contact fill metal 233 is a p-type metal such as tungsten, molybdenum, manganese, cobalt, nickel, ruthenium, rhenium, osmium, iridium, platinum, rhodium, or palladium. Notably, in the context of FIG. 2L, n-type source/drain region 215 has a bi-layer of n-type metal layer 227 and p-type metal layer 229 (e.g., a bi-layer of N then P), and p-type source/drain regions 216 have a tri-layer of p-type metal layer 221, n-type metal layer 227, and p-type metal layer 229 (e.g., a P,N,P tri-layer).

As shown, in FIG. 2H, for example, device structure 298 (and other device structures discussed herein) includes n-type source/drain regions 215 with a gate structure therebetween, the gate structure including gate dielectric 261 and gate electrode 262. Device structure 298 further includes dielectric or isolation structures or materials 241 having sidewalls 257 adjacent n-type source/drain regions 215 (e.g., adjacent the source and/or drain region) such that a portion of sidewalls 257 is laterally adjacent a region 275 above top surface 258 of n-type source/drain regions 215. P-type metal layer 221 is on and covering the portion of sidewalls 257 that is laterally adjacent region 275 above top surface 258 of n-type source/drain regions 215. N-type metal layer 227 is on top surface 258 of n-type source/drain regions 215 and p-type metal layer 229 is on n-type metal layer 227. Contact fill metal 233 is on p-type metal layer 229 and in (i.e., fills) region 275.

Figure 3:
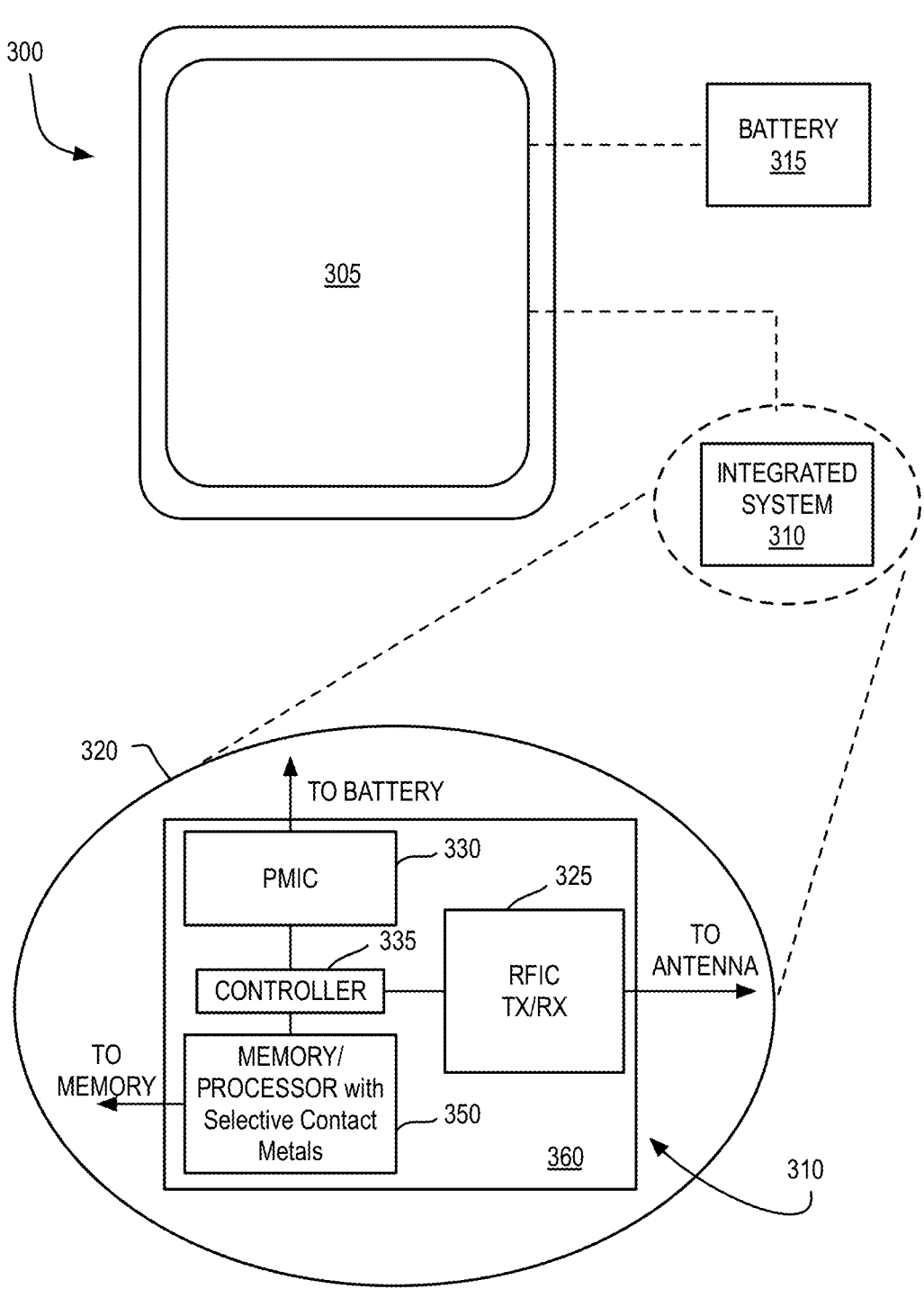
FIG. 3 is an illustrative diagram of a mobile computing platform employing a CMOS integrated circuit having selective source and drain contact metals.

FIG. 3 is an illustrative diagram of a mobile computing platform 300 employing a CMOS integrated circuit having selective source and drain contact metals, arranged in accordance with at least some implementations of the present disclosure. Any die or device having a structure inclusive of any components, materials, or characteristics discussed herein may be implemented by any component of mobile computing platform 300. For example, one or more of device structure 199, 298 or other device structures discussed herein may be deployed by any component of mobile computing platform 300. Mobile computing platform 300 may be any portable device configured for each of electronic data display, electronic data processing, wireless electronic data transmission, or the like. For example, mobile computing platform 300 may be any of a tablet, a smart phone, a netbook, a laptop computer, etc. and may include a display screen 305, which in the exemplary embodiment is a touchscreen (e.g., capacitive, inductive, resistive, etc. touchscreen), a chip-level (system on chip—SoC) or package-level integrated system 310, and a battery 315. Battery 315 may include any suitable device for providing electrical power such as a device consisting of one or more electrochemical cells and electrodes to couple to an outside device. Mobile computing platform 300 may further include a power supply to convert a source power from a source voltage to one or more voltages employed by other devices of mobile computing platform 300.

Integrated system 310 is further illustrated in the expanded view 320. In the exemplary embodiment, packaged device 350 (labeled "Memory/Processor" in FIG. 3) includes at least one memory chip (e.g., RAM), and/or at least one processor chip (e.g., a microprocessor, a multi-core microprocessor, or graphics processor, or the like). In an embodiment, the package device 350 is a microprocessor including an SRAM cache memory. As shown, device 350 may employ a die or device having any transistor structures and/or related characteristics discussed herein. Packaged device 350 may be further coupled to (e.g., communicatively coupled to) a board, a substrate, or an interposer 360 along with, one or more of a power management integrated circuit (PMIC) 330, RF (wireless) integrated circuit (RFIC) 325 including a wideband RF (wireless) transmitter and/or receiver (TX/RX) (e.g., including a digital baseband and an analog front end module further comprises a power amplifier on a transmit path and a low noise amplifier on a receive path), and a controller 335 thereof. In general, packaged device 350 may be also be coupled to (e.g., communicatively coupled to) display screen 305. As shown, one or both of PMIC 330 and/or RFIC 325 may employ a die or device having any transistor structures and/or related characteristics discussed herein.

Functionally, PMIC 330 may perform battery power regulation, DC-to-DC conversion, etc., and so has an input coupled to battery 315 and with an output providing a current supply to other functional modules. In an embodiment, PMIC 330 may perform high voltage operations. As further illustrated, in the exemplary embodiment, RFIC 325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 350 or within a single IC (SoC) coupled to the package substrate of the packaged device 350.

FIG. 4 is a functional block diagram of a computing device 400, arranged in accordance with at least some implementations of the present disclosure. Computing device 400 may be found inside platform 300, for example, and further includes a motherboard 402 hosting a number of components, such as but not limited to a processor 401 (e.g., an applications processor) and one or more communications chips 404, 405. Processor 401 may be physically and/or electrically coupled to motherboard 402. In some examples, processor 401 includes an integrated circuit die packaged within the processor 401. In general, the term "processor" may refer to any device or portion of a device that processes electronic data from registers and/or memory to transform that electronic data into other electronic data that may be stored in registers and/or memory. Any one or more device or component of computing device 400 may include a CMOS integrated circuit having selective source and drain contact metals with any related characteristics discussed herein.

In various examples, one or more communication chips 404, 405 may also be physically and/or electrically coupled to the motherboard 402. In further implementations, communication chips 404 may be part of processor 401. Depending on its applications, computing device 400 may include other components that may or may not be physically and electrically coupled to motherboard 402. These other components may include, but are not limited to, volatile memory (e.g., DRAM) 407, 408, non-volatile memory (e.g., ROM) 410, a graphics processor 412, flash memory, global positioning system (GPS) device 413, compass 414, a chipset 406, an antenna 416, a power amplifier 409, a touchscreen controller 411, a touchscreen display 417, a speaker 415, a camera 403, a battery 418, and a power supply 419, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 404, 405 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 404, 405 may implement any of a number of wireless standards or protocols, including but not limited to those described elsewhere herein. As discussed, computing device 400 may include a plurality of communication chips 404, 405. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 419 may convert a source power from a source voltage to one or more voltages employed by other devices of computing device 400 (or mobile computing platform 300). In some embodiments, power supply 419 converts an AC power to DC power. In some embodiments, power supply 419 converts an DC power to DC power at one or more different (lower) voltages. In some embodiments, multiple power supplies are staged to convert from AC to DC and then from DC at a higher voltage to DC at a lower voltage as specified by components of computing device 400.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a transistor structure comprises a source region, a drain region, and a gate structure therebetween, wherein the source region and the drain region comprise an n-type semiconductor material, a dielectric material comprising a sidewall adjacent the source region, a first metal layer on at least a portion of the sidewall of the dielectric material, the first metal layer comprising a first p-type metal, a second metal layer on the top surface of the source region, the second metal layer comprising an n-type metal, a third metal layer on the second metal layer, the third metal layer comprising a second p-type metal, and a metal fill on the third metal layer, and in a region laterally adjacent the portion of the sidewall.

In one or more second embodiments, further to the first embodiment, the n-type metal comprises at least one of cerium, praseodymium, neodymium, promethium, samarium, europium, gadolinium, terbium, dysprosium, holmium, erbium, thulium, ytterbium, or lutetium.

In one or more third embodiments, further to the first or second embodiments, the n-type metal comprises at least one of magnesium, calcium, strontium, or barium.

In one or more fourth embodiments, further to any of the first through third embodiments, the n-type metal comprises at least one of scandium, yttrium, lanthanum, titanium, zirconium, or hafnium.

In one or more fifth embodiments, further to any of the first through fourth embodiments, the first p-type metal comprises one of tungsten, molybdenum, manganese, cobalt, nickel, ruthenium, rhenium, osmium, iridium, platinum, rhodium, or palladium, and the second p-type metal comprises another of tungsten, molybdenum, manganese, cobalt, nickel, ruthenium, rhenium, osmium, iridium, platinum, rhodium, or palladium.

In one or more sixth embodiments, further to any of the first through fifth embodiments, the metal fill comprises tungsten, the first p-type metal comprises one of molybdenum, manganese, cobalt, nickel, ruthenium, rhenium, osmium, iridium, platinum, rhodium, or palladium, and the second p-type metal comprises another of molybdenum, manganese, cobalt, nickel, ruthenium, rhenium, osmium, iridium, platinum, rhodium, or palladium.

In one or more seventh embodiments, further to any of the first through sixth embodiments, the transistor structure further comprises a second dielectric material comprising a second sidewall adjacent the drain region, at least a second portion of the second sidewall laterally adjacent a second region above a top surface of the drain region, a fourth metal layer on the second portion of the second sidewall, the fourth metal layer comprising the first p-type metal, a fifth metal layer on the top surface of the drain region, the fifth metal layer comprising the n-type metal, a sixth metal layer on the fifth metal layer, the sixth metal layer comprising the second p-type metal, and a second metal fill on the sixth metal layer, and in the second region laterally adjacent the portion of the second sidewall and above the top surface of the drain region.

In one or more eighth embodiments, further to any of the first through seventh embodiments, the gate structure is over a channel region, the channel region comprising a portion of a semiconductor fin or one of a plurality of semiconductor nano-ribbons.

In one or more ninth embodiments, a system comprises a power supply and an integrated circuit die coupled to the power supply, the integrated circuit die comprising a transistor structure according to any of the first through eighth embodiments.

In one or more tenth embodiments, a complementary metal-oxide-semiconductor device comprises a first transistor comprising a first source or drain region comprising an n-type semiconductor material, a dielectric material comprising a sidewall adjacent the first source or drain region, at least a portion of the sidewall laterally adjacent a region above a top surface of the first source or drain region, a first metal layer comprising a first p-type metal on the portion of the sidewall, a second metal layer comprising an n-type metal on the top surface of the first source or drain region, a third metal layer comprising a second p-type metal or the first p-type metal on the second metal layer, and a first metal fill on the third metal layer, and in the region laterally adjacent the portion of the sidewall and above the top surface of the source region, and a second transistor comprising a second source or drain region comprising a p-type semiconductor material, a fourth metal layer comprising the first p-type metal on a top surface of the second source or drain region, and a second metal fill over the fourth metal layer.

In one or more eleventh embodiments, further to the tenth embodiment, the n-type metal comprises at least one of cerium, praseodymium, neodymium, promethium, samarium, europium, gadolinium, terbium, dysprosium, holmium, erbium, thulium, ytterbium, or lutetium.

In one or more twelfth embodiments, further to the tenth or eleventh embodiments, the n-type metal comprises at least one of magnesium, calcium, strontium, or barium.

In one or more thirteenth embodiments, further to any of the tenth through twelfth embodiments, the n-type metal comprises at least one of scandium, yttrium, lanthanum, titanium, zirconium, or hafnium.

In one or more fourteenth embodiments, further to any of the tenth through thirteenth embodiments, the first p-type metal comprises one of tungsten, molybdenum, manganese, cobalt, nickel, ruthenium, rhenium, osmium, iridium, platinum, rhodium, or palladium, and the second p-type metal comprises another of tungsten, molybdenum, manganese, cobalt, nickel, ruthenium, rhenium, osmium, iridium, platinum, rhodium, or palladium.

In one or more fifteenth embodiments, further to any of the tenth through fourteenth embodiments, the second transistor comprises a fifth metal layer comprising the n-type metal on the fourth metal layer and a sixth metal layer comprising the second p-type metal or the first p-type metal on the fifth metal layer, wherein the second metal fill is on the sixth metal layer.

In one or more sixteenth embodiments, further to any of the tenth through fifteenth embodiments, a portion of the third metal layer is between the first metal layer and the first metal fill, the third metal layer comprising the second p-type metal.

In one or more seventeenth embodiments, further to any of the tenth through sixteenth embodiments, the first source or drain region is adjacent a channel region, the channel region comprising a portion of a semiconductor fin or one of a plurality of semiconductor nano-ribbons.

In one or more eighteenth embodiments, a method comprises forming a first p-type metal layer on a first source or drain region, a second source or drain region, and a dielectric material sidewall adjacent the first source or drain region, the first source or drain region comprising an n-type semiconductor material and the second source or drain region comprising a p-type semiconductor material, masking the second source or drain region with a mask layer that exposes the first source or drain region, selectively removing a first portion of the p-type metal layer from the first source or drain region, wherein at least a second portion of the p-type metal layer remains on the dielectric material sidewall after said selective removal, selectively depositing an n-type metal layer on the first source or drain region, selectively depositing a second p-type metal layer on the n-type metal layer, removing the mask layer, and forming a fill metal on the second p-type metal layer over the first source or drain region and on the first p-type metal layer over the second source or drain region.

In one or more nineteenth embodiments, further to the eighteenth embodiment, said selectively depositing the n-type metal layer and selectively depositing the second p-type metal layer comprises operations performed in the same vacuum chamber without vacuum release therebetween.

In one or more twentieth embodiments, further to the eighteenth or nineteenth embodiments, said selectively removing the first portion of the p-type metal layer comprises a sputter etch operation.

In one or more twenty-first embodiments, further to any of the eighteenth through twentieth embodiments, the n-type metal comprises at least one of cerium, praseodymium, neodymium, promethium, samarium, europium, gadolinium, terbium, dysprosium, holmium, erbium, thulium, ytterbium, lutetium, magnesium, calcium, strontium, barium, scandium, yttrium, lanthanum, titanium, zirconium, or hafnium.

In one or more twenty-second embodiments, further to any of the eighteenth through twenty-first embodiments, the first p-type metal layer and the second p-type metal layer comprises different p-type metal materials.

In one or more twenty-third embodiments, further to any of the eighteenth through twenty-second embodiments, the metal fill comprises tungsten, the first p-type metal layer comprises one of molybdenum, manganese, cobalt, nickel, ruthenium, rhenium, osmium, iridium, platinum, rhodium, or palladium, and the second p-type metal layer comprises another of molybdenum, manganese, cobalt, nickel, ruthenium, rhenium, osmium, iridium, platinum, rhodium, or palladium.

In one or more twenty-fourth embodiments, further to any of the eighteenth through twenty-third embodiments, during said selectively depositing the n-type metal layer, a lateral surface of a second dielectric material is exposed.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
a first transistor comprising:
    a first source or drain region comprising an n-type semiconductor material;
    a dielectric material comprising a sidewall adjacent the first source or drain region;
    a first metal layer comprising a first p-type metal on the sidewall;
    a second metal layer comprising an n-type metal, wherein the second metal layer has a first portion discontinuous from a second portion, wherein the first portion is on a top surface of the first source or drain region and the second portion is on the first metal layer;
    a third metal layer comprising a second p-type metal or the first p-type metal on the second metal layer; and
    a first metal fill of a first metal on the third metal layer, and in a region laterally adjacent the sidewall; and
a second transistor comprising:
    a second source or drain region comprising a p-type semiconductor material;
    a fourth metal layer comprising the first p-type metal on a top surface of the second source or drain region; and
    a second metal fill of the first metal on the fourth metal layer.

2. The apparatus of claim 1, wherein the n-type metal comprises at least one of cerium, praseodymium, neodymium, promethium, samarium, europium, gadolinium, terbium, dysprosium, holmium, erbium, thulium, ytterbium, or lutetium.

3. The apparatus of claim 1, wherein the n-type metal comprises at least one of magnesium, calcium, strontium, or barium.

4. The apparatus of claim 1, wherein the n-type metal comprises at least one of scandium, yttrium, lanthanum, titanium, zirconium, or hafnium.

5. The apparatus of claim 1, wherein the third metal layer comprises the first p-type metal, and the first p-type metal comprises one of tungsten, molybdenum, manganese, cobalt, nickel, ruthenium, rhenium, osmium, iridium, platinum, rhodium, or palladium.

6. The apparatus of claim 1, wherein the third metal layer comprises the second p-type metal, the first p-type metal comprises one of tungsten, molybdenum, manganese, cobalt, nickel, ruthenium, rhenium, osmium, iridium, platinum, rhodium, or palladium, and the second p-type metal comprises another of tungsten, molybdenum, manganese, cobalt, nickel, ruthenium, rhenium, osmium, iridium, platinum, rhodium, or palladium.

7. The apparatus of claim 1, wherein a portion of the third metal layer is between the first metal layer and the first metal fill, the third metal layer comprising the second p-type metal.

8. The apparatus of claim 1, wherein the first metal comprises tungsten.

9. The apparatus of claim 1, wherein the n-type semiconductor material comprises silicon and/or germanium doped with one or more of phosphorous, arsenic, antimony, and bismuth.

10. The apparatus of claim 1, wherein the p-type semiconductor material comprises silicon and/or germanium doped with one or more of boron, gallium, or indium.

11. The apparatus of claim 1, further comprising:
an integrated circuit die comprising the first transistor and the second transistor; and
a power supply coupled to the integrated circuit die.

12. An apparatus, comprising:
a first transistor comprising:
    an n-type semiconductor material source or drain;
    a dielectric material comprising a sidewall adjacent the n-type semiconductor material source or drain;
    a first p-type metal on the sidewall;
    an n-type metal, wherein the n-type metal has a first portion discontinuous from a second portion, wherein the first portion is on a top surface of the n-type semiconductor material source or drain and the second portion is on the first p-type metal;
    a second p-type metal on the n-type metal; and
    a metal fill on the second p-type metal, and in a region laterally adjacent the sidewall; and
a second transistor comprising:
    a p-type semiconductor material source or drain;
    the first p-type metal on a top surface of the p-type semiconductor material source or drain; and
    the metal fill on the first p-type metal.

13. The apparatus of claim 12, wherein the n-type metal comprises at least one of cerium, praseodymium, neodymium, promethium, samarium, europium, gadolinium, terbium, dysprosium, holmium, erbium, thulium, ytterbium, or lutetium.

14. The apparatus of claim 12, wherein the n-type metal comprises at least one of magnesium, calcium, strontium, or barium.

15. The apparatus of claim 12, wherein the n-type metal comprises at least one of scandium, yttrium, lanthanum, titanium, zirconium, or hafnium.

16. The apparatus of claim 12, wherein the first p-type metal comprises one of tungsten, molybdenum, manganese, cobalt, nickel, ruthenium, rhenium, osmium, iridium, platinum, rhodium, or palladium, and the second p-type metal comprises another of tungsten, molybdenum, manganese, cobalt, nickel, ruthenium, rhenium, osmium, iridium, platinum, rhodium, or palladium.

17. The apparatus of claim 12, wherein the n-type semiconductor material source or drain is adjacent a channel region, the channel region comprising a portion of a semiconductor fin.

18. The apparatus of claim 12, wherein the metal fill comprises tungsten.

19. The apparatus of claim 12, wherein the n-type semiconductor material source or drain comprises silicon and/or germanium doped with one or more of phosphorous, arsenic, antimony, and bismuth.

20. The apparatus of claim 12, wherein the p-type semiconductor material source or drain comprises silicon and/or germanium doped with one or more of boron, gallium, or indium.

21. The apparatus of claim 12, further comprising:

an integrated circuit die comprising the first transistor and the second transistor; and a power supply coupled to the integrated circuit die.

* * * * *